United States Patent
Oh et al.

(10) Patent No.: US 10,319,736 B2
(45) Date of Patent: Jun. 11, 2019

(54) VERTICAL MEMORY STRUCTURE WITH STRESS-INDUCING INSULATING LAYERS

(71) Applicant: SK hynix Inc., Gyeonggi-do (KR)

(72) Inventors: Jeong Seob Oh, Chungcheongbuk-do (KR); Dong Hyoub Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 37 days.

(21) Appl. No.: 15/609,445

(22) Filed: May 31, 2017

(65) Prior Publication Data
US 2018/0053780 A1    Feb. 22, 2018

(30) Foreign Application Priority Data
Aug. 19, 2016 (KR) .................. 10-2016-0105758

(51) Int. Cl.
| | |
|---|---|
| *H01L 27/11582* | (2017.01) |
| *H01L 29/10* | (2006.01) |
| *H01L 29/78* | (2006.01) |
| *H01L 21/02* | (2006.01) |
| *H01L 21/311* | (2006.01) |
| *H01L 29/792* | (2006.01) |
| *H01L 27/11575* | (2017.01) |

(52) U.S. Cl.
CPC .... *H01L 27/11582* (2013.01); *H01L 29/1037* (2013.01); *H01L 29/7843* (2013.01); *H01L 21/02112* (2013.01); *H01L 21/02164* (2013.01); *H01L 21/31111* (2013.01); *H01L 27/11575* (2013.01); *H01L 29/7926* (2013.01)

(58) Field of Classification Search
CPC .......... H01L 27/11582; H01L 29/1037; H01L 29/7843; H01L 29/7926
See application file for complete search history.

(56) References Cited

U.S. PATENT DOCUMENTS

| | | | |
|---|---|---|---|
| 2004/0173790 A1* | 9/2004 | Yeo ................... | H01L 21/76254 257/19 |
| 2012/0064682 A1* | 3/2012 | Jang ................. | H01L 21/28273 438/268 |
| 2015/0206590 A1* | 7/2015 | Sakuma ................ | G11C 16/14 365/185.11 |
| 2015/0236038 A1* | 8/2015 | Pachamuthu ..... | H01L 27/11582 257/326 |

FOREIGN PATENT DOCUMENTS

| | | |
|---|---|---|
| KR | 101538071 | 7/2015 |
| KR | 1020150118929 | 10/2015 |

OTHER PUBLICATIONS

Danielsson, Ö., Simulations of Silicon Carbide Chemical Vapor Deposition, Linköping Studies in Science and Technology, No. 773, 2002.
Pippel, E. et al., Interfaces between 4H-SiC and SiO2: Microstructure, nanochemistry, and near-interface traps, Journal of Applied Physics 97, 034302, 2005.
Shi, X. et al., The Deposition of Polycrystalline SiGe with Different Ge Precursors, ECS Transactions, 3 (7), pp. 849-860, 2006.

* cited by examiner

*Primary Examiner* — Allen L Parker
*Assistant Examiner* — Gustavo G Ramallo
(74) *Attorney, Agent, or Firm* — IP & T Group LLP

(57) ABSTRACT

The present disclosure relates to a semiconductor device including a stress control insulating layer or a stress control pattern to control a stress applied to an interlayer insulating layer or a stacked body in a desirable direction.

13 Claims, 15 Drawing Sheets

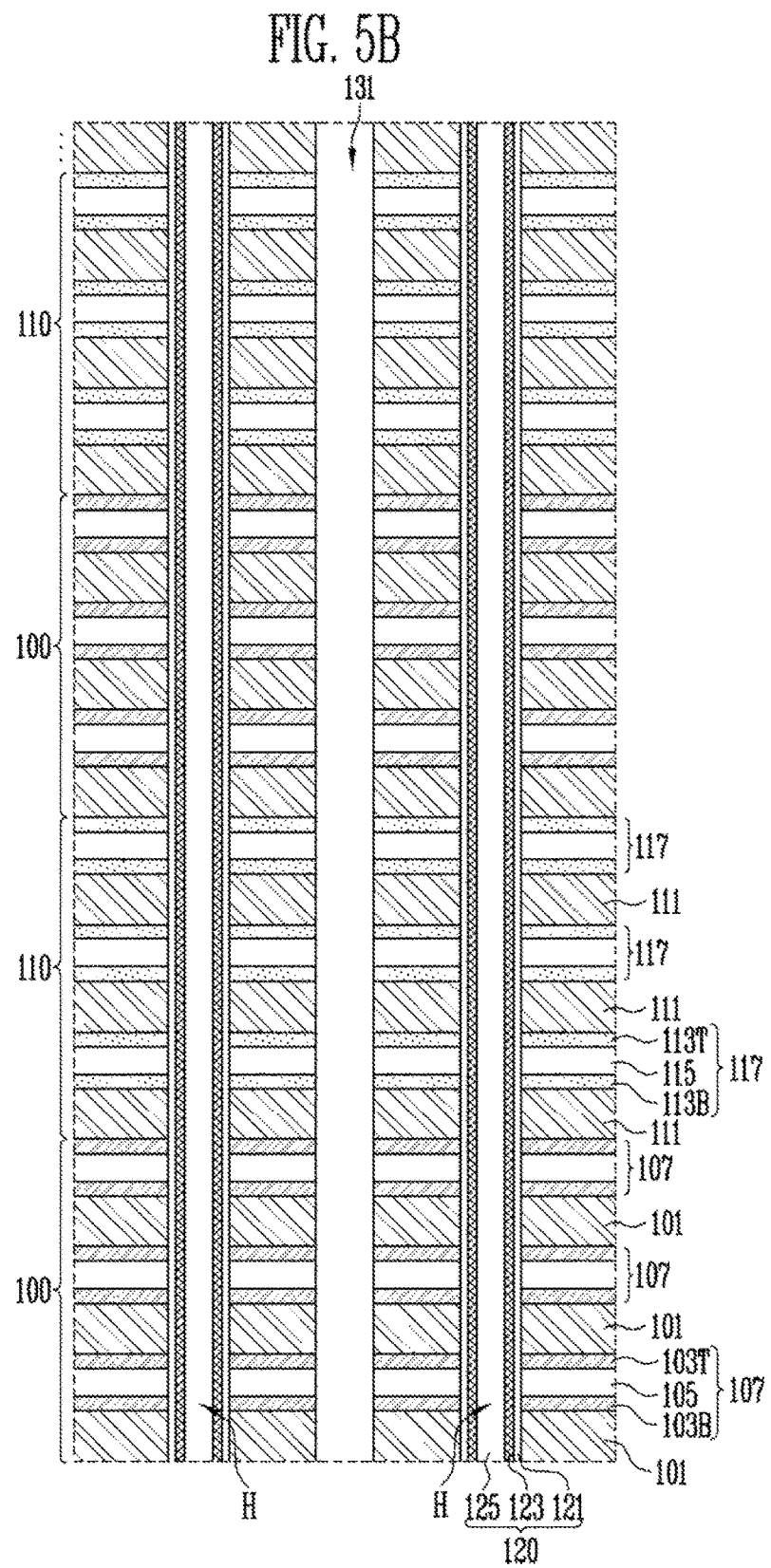

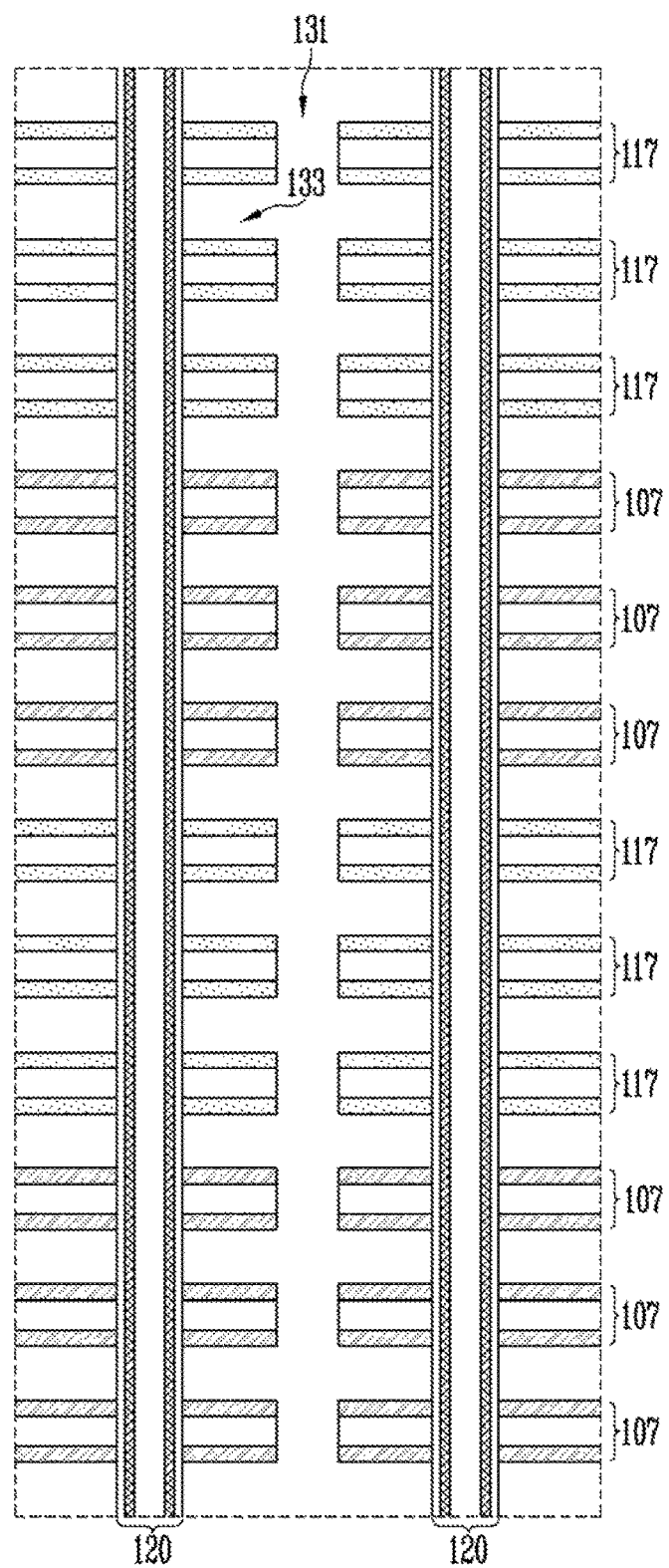

VERTICAL MEMORY STRUCTURE WITH STRESS-INDUCING INSULATING LAYERS

CROSS-REFERENCE TO RELATED APPLICATION

The present application claims priority under 35 U.S.C. § 119(a) to Korean patent application number 10-2016-0105758, filed on Aug. 19, 2016, the entire disclosure of which is incorporated herein by reference in its entirety.

BACKGROUND

1. Field of Invention

Various embodiments of the invention relate to a semiconductor device and, more particularly, to a semiconductor device including a three-dimensional semiconductor device.

2. Description of Related Art

The semiconductor device may include a memory device having a plurality of memory cells for storing data. High integration semiconductor devices may arrange the memory cells in a three-dimensional array. Generally, the degree of integration of the semiconductor device may increase by increasing the number of stacked layers in the 3-dimensional memory cell array. However, as the number of stacked layers of the memory cells increases, structural distortion such as bending may occur.

SUMMARY

According to an embodiment, a semiconductor device may include a first stacked body including at least one first sub-set in which a first conductive pattern and a first insulating structure are stacked, a second stacked body arranged on the first stacked body and including at least one second sub-set in which a second conductive pattern and a second insulating structure are stacked, and a channel layer penetrating the first stacked body and the second stacked body. The first insulating structure may induce a first stress and the second insulating structure may induce a second stress in a direction opposite to the first stress.

According to an embodiment, a semiconductor device may include a channel layer, and insulating structures surrounding the channel layer and stacked to be spaced apart from one another. Each of the insulating structures may include a first stress control insulating layer inducing a first stress, a second stress control insulating layer inducing a second stress in direction opposite to the first stress, and an interlayer insulating layer arranged between the first stress control insulating layer and the second stress control insulating layer.

According to an embodiment, a semiconductor device may include a channel layer, a stacked body surrounding the channel layer and including interlayer insulating layers and conductive patterns alternately stacked, and support pillars penetrating the stacked body. Each of the support pillars may include a core pattern and a stress control pattern surrounding the core pattern and inducing compressive stress or tensile stress to the core pattern.

According to an embodiment, a semiconductor device, may include a first stacked body, a second stacked body arranged to be spaced apart from the first stacked body, and a stress control insulating layer filling a space between the first stacked body and the second stacked body. The stress control insulating layer may include a first material layer arranged closer to the first stacked body than the second stacked body and a second material layer arranged closer to the second stacked body than the first stacked body. The stress control insulating layer may apply stress toward at least one of the first stacked body and the second stacked body.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which:

FIGS. 5A to 5D are cross-sectional diagrams illustrating a manufacturing method of the semiconductor device shown in FIG. 2, according to an embodiment of the present invention;

DETAILED DESCRIPTION

Figure 1A:
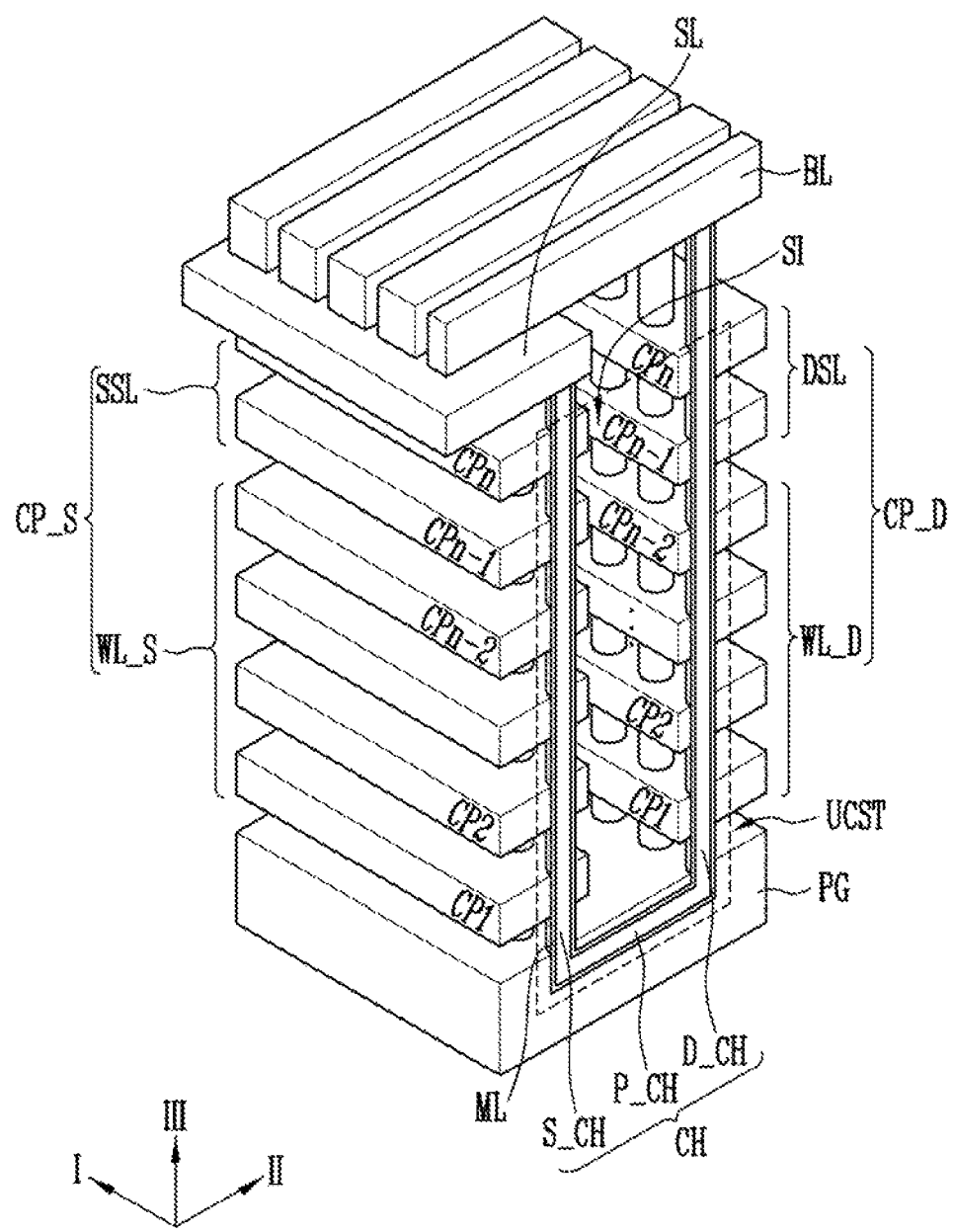
FIGS. 1A to 1C are perspective diagrams illustrating memory strings of a semiconductor device, according to various embodiments of the present invention.

Hereafter, various embodiments of the invention will be described with reference to the accompanying figures in detail. However, it is noted that the scope of the present invention is not limited to the detailed description of the specification. Moreover, the described embodiments should not be construed as limited to the particular shapes of regions illustrated herein but may include deviations in shapes. It will be further understood by those skilled in the art to which the present invention pertains that various changes and modifications may be made to the described embodiments without departing from the spirit and scope of the invention as set forth in the claims.

Rather, the described embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Various embodiments are directed to a semiconductor device that may improve the structural stability and a manufacturing method thereof.

Figure 1B:
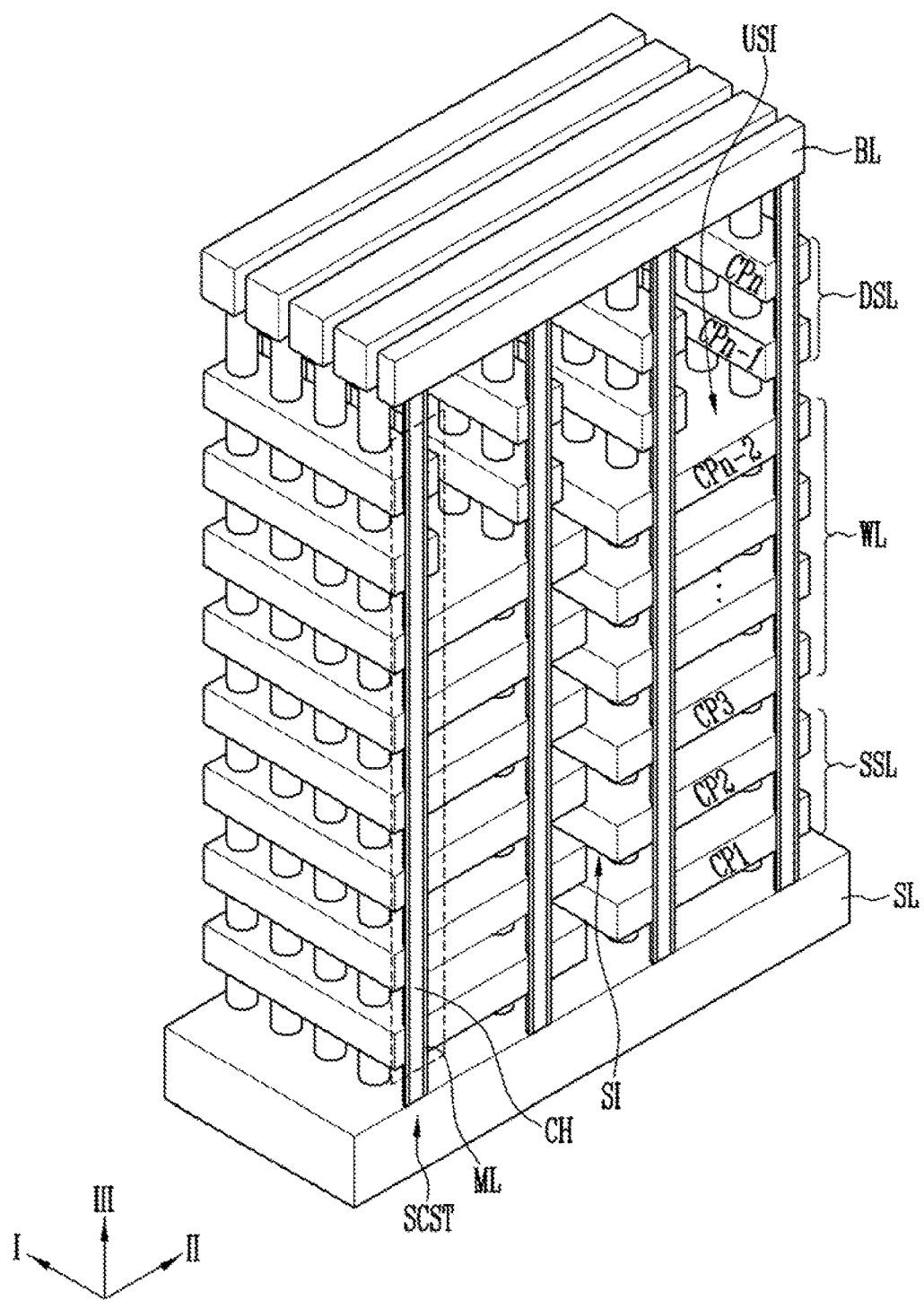
Figure 1C:
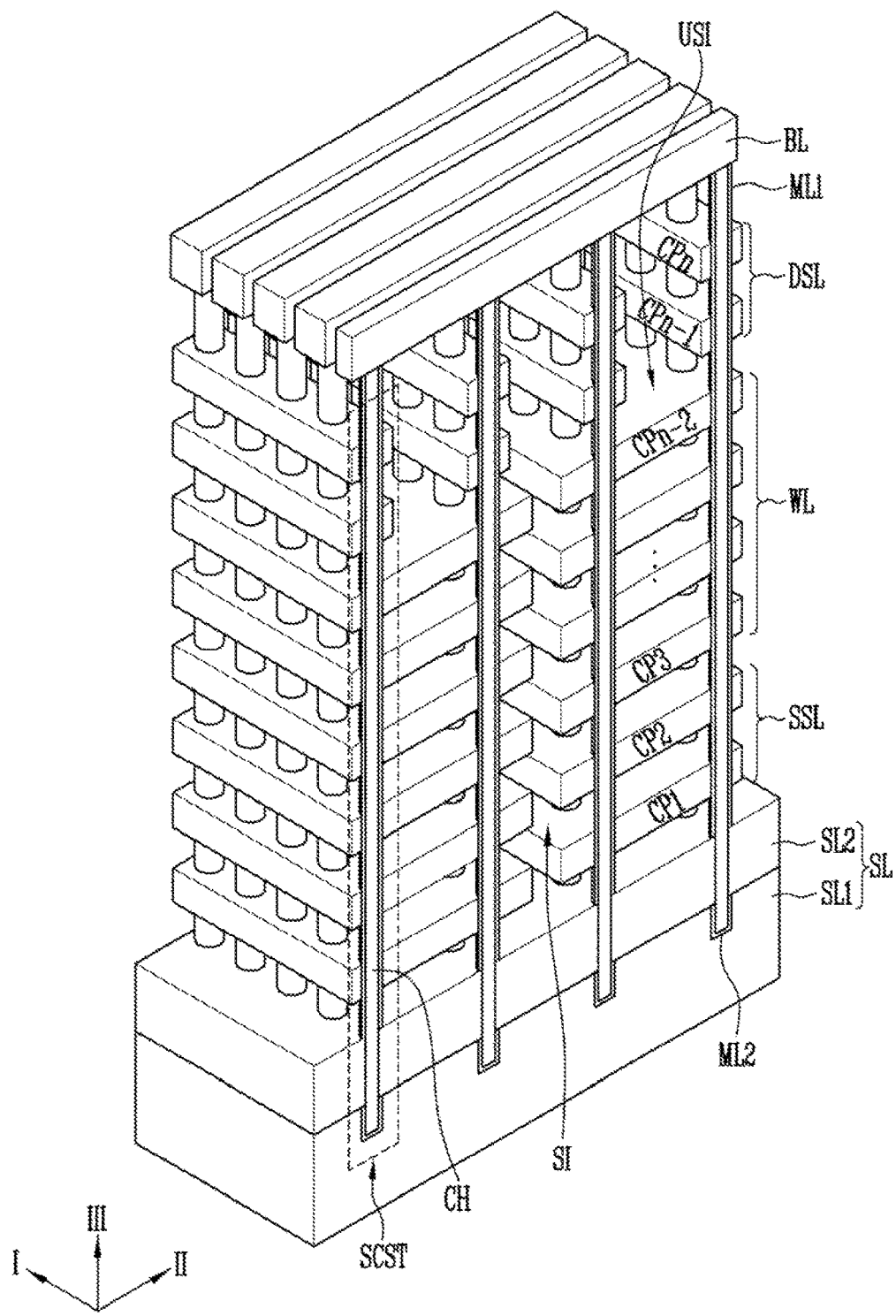

FIGS. 1A to 1C are perspective diagrams illustrating memory strings of a semiconductor device according to various embodiments of the present invention. To simply focus on a structure of a semiconductor device according to an embodiment of the present invention, description of interlayer insulating layers and stress control layers are omitted in FIGS. 1A to 1C.

Referring to FIGS. 1A to 1C, embodiments of the present invention include a three-dimensional string UCST or SCST. The three-dimensional string UCST has a generally U shape as illustrated in FIG. 1A. The three-dimensional string SCST has a straight line shape as illustrated in FIGS. 1B and 1C.

Referring to FIG. 1A, the memory string UCST having the U shape may include memory cells and select transistors arranged along a U shape channel layer CH. Gates of the memory cells and gates of the select transistors may be connected to conductive patterns CP1 to CPn.

The channel layer CH may include a pipe channel layer P_CH embedded inside a pipe gate PG, a source side channel layer S_CH and a drain side channel layer D_CH extending from the pipe channel layer P_CH. The pipe channel layer P_CH may be extending in the second direction II which may be a substantially horizontal direction. The source and the drain side channel layers S_CH and D_CH may be extending in the third direction III which may be a substantially vertical direction. The channel layer CH may be formed to completely fill the central area of the U shape hole. In an alternative embodiment (not shown), the channel layer CH may have a tube shape surrounding an insulating pillar filling a central area of the U shape hole. An outer wall of the channel layer CH may be surrounded by a multilayer ML.

The channel layer CH may be electrically connected between a source line SL and a bit line BL. The bit line BL and the source line SL may be arranged in different levels. For example, as illustrated in FIG. 1A, the bit line BL is positioned at a higher level than the source line SL. The bit line BL and the source line SL may be spaced apart from each other. For example, the source line SL may be arranged under the bit line BL at a level that is a certain distance below the bit line BL. The space between the source line SL and the bit line BL may be filled with an insulating layer (not shown). The source line SL may be electrically connected to the top of the source side channel layer S_CH. The source line SL may extend in a first direction I. A source contact plug may be formed between the source line SL and the source side channel layer S_CH (not shown). The bit line BL may be electrically connected to the top of the drain side channel layer D_CH. The bit line BL may extend in a second direction II intersecting the first direction I. A drain contact plug may be formed between the bit line BL and the drain side channel layer D_CH (not shown). A plurality of bit lines BL may be spaced apart at a regular interval in a parallel orientation to each other along the first direction I. Likewise, a plurality of channel layers CH may be spaced apart at a regular interval along the first direction I in a parallel orientation to each other.

Conductive patterns CP1 to CPn may be arranged in n layers spaced apart at a regular interval along the third direction III in a parallel orientation to each other under the bit line BL and the source line SL. The conductive patterns CP1 to CPn may include an equal number of a plurality of source side conductive patterns CP_S and drain side conductive patterns CP_D. Each conductive pattern CP1 to CPn may extend in the first direction I and the second direction II. In the first direction I the conductive patterns CP1 to CPn may extend to a length sufficient to include the plurality of channel layers CH.

The source side conductive patterns CP_S may surround the source side channel layer S_CH and be stacked to be spaced apart from one another. The source side conductive patterns CP_S may be divide into a plurality of source side word lines WL_S and at least one source select line SSL. The source select line SSL may be arranged to be positioned above the source side word lines WL_S. The source select line SSL may be arranged in one or more layers on the source side word lines WL_S. FIG. 1A exemplifies that the source select line SSL consists of an nth pattern CPn arranged on a uppermost layer of the source side conductive patterns CP_S and an (n−1)th pattern (CPn−1) arranged under the nth pattern CPn. However, the present invention is not limited thereto and generally at least one source select line SSL may be employed.

The drain side conductive patterns CP_D may surround the drain side channel layer D_CH, and be stacked to be spaced apart from one another. The drain side conductive patterns CP_D may include a plurality of drain side word lines WL_D and at least one drain select line DSL. The drain select line DSL may be arranged on the drain side word lines WL_D. The drain select line DSL may be arranged in one or more layers on the drain side word lines WL_D. FIG. 1A exemplifies that the drain select line DSL consists of an nth pattern CPn arranged on an uppermost layer of the drain side conductive patterns CP_D and an (n−1)th pattern (CPn−1) arranged under the nth pattern CPn. However, the present invention is not limited thereto and generally at least one drain select line DSL may be employed.

The source side conductive patterns CP_S and the drain side conductive patterns CP_D may be separated from each other with a slit SI interposed therebetween.

The pipe gate PG may be arranged to be positioned at a certain distance under the lowermost conductive pattern CP1, and may be formed to surround the plurality of pipe channel layers P_CH. The space between the pipe gate PG and the lowermost conductive pattern CP1 may be filled with an insulating layer (not shown).

Source side memory cells may be formed at interconnections of the source side channel layer S_CH and the source side word lines WL_S. Drain side memory cells may be formed at interconnections of the drain side channel layer D_CH and the drain side word lines WL_D. A source select transistor may be formed at an interconnection of the source side channel layer S_CH and the source select line SSL, and a drain select transistor may be formed at an interconnection of the drain side channel layer D_CH and the drain select line DSL. A pipe transistor may be formed at an interconnection of the pipe channel layer P_CH and the pipe gate PG. The source select transistor, the source side memory cells, the pipe transistor, the drain side memory cells, and the drain select transistor arranged along a single channel layer CH are connected in series through the channel layer CH. The source select transistor, the source side memory cells, the pipe transistor, the drain side memory cells, and the drain select transistor connected in series define the U shape memory string UCST in accordance with the U shape of the channel layer CH. The source side word lines WL_S may transmit signals to gates of the source side memory cells, the drain side word lines WL_D may transmit signals to gates of the drain side memory cells, the source select line SSL may transmit a signal to the source select transistor, the drain select line DSL may transmit a signal to a gate of the drain select transistor, and the pipe gate PG may transmit a signal to the pipe gate PG of the pipe transistor. The pipe transistor may respond to a signal applied to the pipe gate PG, and connect the source side memory cells to the drain side memory cells.

The channel layer CH may be formed in various other shapes such as a substantially W shape-. Arrangement of the memory cells may vary depending on a structure of the channel layer CH, and the structure of the memory string may be formed in various shapes accordingly.

Referring to FIGS. 1B and 1C, the memory string SCST having a straight line shape may include memory cells and select transistors stacked along the channel layer CH having a straight line shape. The gates of the memory cells and the gates of the select transistors may be connected to the conductive patterns CP1 to CPn.

The channel layer CH may be formed to completely fill the central area of a straight hole extending in the third direction III. In an alternative embodiment (not shown), the channel layer CH may be formed to have the form of a straight tube by surrounding the insulating pillar that fills the central area of the straight hole.

The top of the channel layer CH may be electrically connected to the bit line BL. The bit line BL may extend in the second direction II. A drain contact plug (not shown) may be formed between the bit line BL and the channel layer CH. A plurality of bit lines BL may be spaced apart along the first direction I at a regular interval and in a parallel orientation to each other. A plurality of channel layers CH may be spaced apart at a regular interval along the first direction I. A plurality of channel layers CH may also be spaced apart along the second direction II.

The channel layer CH may also be connected to the source layer SL. The source layer SL may be formed in various structures.

As shown in FIG. 1B, the source layer SL may have the shape of a continuous layer extending in the first direction I and the second direction II and may contact the bottom surfaces of the plurality of the channel layers CH. In an embodiment, the source layer SL may be a doped polysilicon layer, however, the invention is not limited only to such material. Any suitable material may be employed to form the source layer. In the illustrated embodiment of FIG. 1B, the bottom surface of each channel layer CH contacts the top surface of the source layer SL, and extends in a third direction III toward a corresponding bit line BL.

A side wall of each channel layer CH illustrated in FIG. 1B may be surrounded by the multilayer ML.

As shown in FIG. 1C, in an alternative embodiment, a lower portion of each of the channel layers CH may extend inside the source layer SL. That is, the lower portion of each of the channel layers CH may penetrate a portion of the source layer SL.

More specifically, referring to the embodiment of FIG. 1C, the source layer SL may be formed in a stacked structure of a first source layer SL1 and a second source layer SL2. The first source layer SL1 may surround the lower portion of the channel layer CH. The second source layer SL2 may be arranged on the first source layer SL1, and contact the top of the first source layer SL1 and the side wall of the channel layer CH. The second source layer SL2 may surround the channel layer CH.

The outer wall of the channel layer CH shown in FIG. 1C may be surrounded by a first multi-pattern ML1 or a second multi-pattern ML2. The first and second multi-patterns ML1 and ML2 each may include a tunnel insulating layer, a data storing layer and a blocking insulating layer. The first multi-pattern ML1 may be formed to surround the side wall of a top part of the channel layer CH which is protruding above the source layer SL. The second multi-pattern ML2 may be arranged between the first source layer SL1 and the channel layer CH. The first and second multi-patterns ML1 and the ML2 may be separated from each other with the second source layer SL2 interposed therebetween. As Illustrated in FIG. 1C, the channel layer CH which is within the second source layer SL2, is not surrounded by the multilayer ML but instead directly contacts the second layer SL2.

Referring to FIGS. 1B and 1C, the conductive patterns CP1 to CPn may be arranged on "n" layers spaced apart from one another between the bit line BL and the source layer SL. The conductive patterns CP1 to CPn may surround the channel layer CH while being stacked to be spaced apart from one another. The conductive patterns CP1 to CPn may include the source select line SSL, the word lines WL and the drain select line DSL. The source select line SSL may be arranged to be the first conductive layer over the source layer SL. The word lines WL may be arranged to be over the source select line SSL and the drain select line DSL may be arranged to be over the word lines WL. In the intervals between the various conductive layers there may be insulating layers (not shown). The conductive patterns CP1 to CPn may be separated by the slit SI to form a plurality of sub-structures.

The source select line SSL may be arranged in one or more layers under the word lines WL. FIGS. 1B and 1C exemplify that the source select line SSL consists of a first pattern CP1 arranged on a lowermost layer of the conductive patterns CP1 to CPn and a second pattern CP2 above the first pattern CP1. However, the present invention is not limited thereto.

The drain select line DSL may be arranged in one or more layers on the word lines WL. FIGS. 1B and 1C exemplify that the drain select line DSL consists of an nth pattern CPn arranged on an uppermost layer of the conductive patterns CP1 to CPn and an (n−1)th pattern CPn−1 under the nth pattern CPn. However, the present invention is not limited thereto. Generally, each SCST string may have at least one source select line, at least one drain select line and a plurality of word lines.

The conductive patterns CP1 to CPn may be divided by the slit SI. One of the source select line SSL and the drain select line DSL may be divided to have a smaller size in the second direction II than the word lines WL. For example, the channel layers CH that each of the word lines WL commonly surrounds may be divided into a first group and a second group each surrounded by the separate drain select line DSL. The drain select line DSL may be separated by an upper slit USI in addition to the slit SI to have a smaller dimension in the second direction II (also referred to as a width) than the word lines WL.

According to the structure described in FIGS. 1B and 1C, the memory cells may be formed at interconnections of the channel layer CH and the word lines WL, the drain select transistor may be formed at an interconnection of the channel layer CH and the drain select line DSL, and the source select transistor may be formed at an interconnection of the channel layer CH and the source select line SSL. The source select transistor, the memory cells, and the drain select transistor aligned in a row along a signal channel layer CH may be connected in series through the channel layer CH and define the memory string SCST having a straight line shape. The word lines WL may transmit a signal to the gates of the memory cells, the source select line SSL may transmit a signal to a gate of the source select transistor, and the drain select line DSL may transmit a signal to a gate of the drain select transistor.

As described above in FIGS. 1A to 1C, gates of the memory string UCST or SCST may be connected to the stacked conductive patterns CP1 to CPn spaced apart from one another along an extension direction of the channel layer CH. In order to increase the number of stacked layers of the memory cells, the number of stacked layers of the conductive patterns CP1 to CPn may be increased. In the various embodiments of the present invention, as the number of stacked layers of the conductive patterns CP1 to CPn increases, stress applied to the semiconductor device may be controlled in various ways to improve the structural stability of the semiconductor device.

In an embodiment of the present invention, to improve the structural stability of the semiconductor device, the stress may be controlled in a desirable direction by varying the arrangement position of a stress control insulating layer (or a stress control pattern). Hereafter, the detailed description of various stress controlling methods according to the embodiments of the present invention will be provided.

Figure 2:
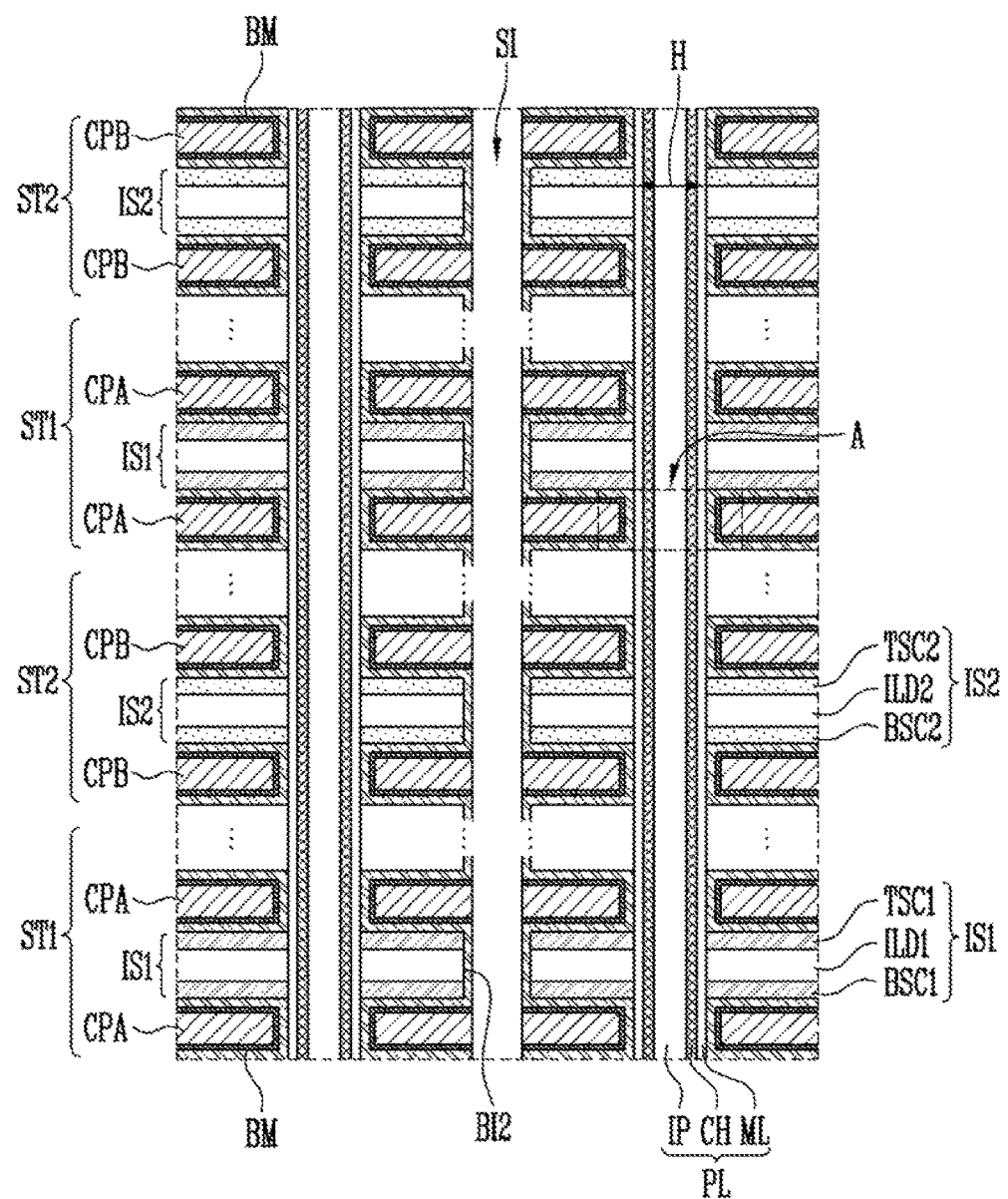
FIG. 2 is a cross-sectional diagram illustrating a semiconductor device, according to an embodiment of the present invention.

FIG. 2 is a cross-sectional diagram illustrating a semiconductor device, according to an embodiment of the present invention Referring to FIG. 2, the semiconductor device may include the channel layers CH and two or more stacked groups stacked along the extending direction of the channel layers CH and surrounding the channel layers CH. Each of the stacked groups may include a first stacked body ST1 and a second stacked body ST2 arranged on the first stacked body ST1. That is, the semiconductor device may include first stacked bodies ST1 and second stacked bodies ST2 alternately stacked. The first stacked bodies ST1 and the second stacked bodies ST2 alternately stacked may be penetrated by the slit SI.

Each of the first stacked bodies ST1 may include at least one first subset including a first conductive pattern CPA and a first insulating structure IS1 sequentially stacked. For example, each of the first stacked bodies ST1 may include one or more first subsets stacked on each other.

Each of the second stacked bodies ST2 may include at least one set of a second subset including a second conductive pattern CPB and a second insulating structure IS2 sequentially stacked. For example, each of the second stacked bodies ST2 may include one or more second subsets stacked on each other.

The number of stacked layers of the first subset constituting each of the first stacked bodies ST1 may be the same as the number of stacked layers of the second subset constituting each of the second stacked bodies ST2.

For example, in an embodiment, wherein the first stacked body ST1 may employ one first subset and the second stacked body may ST2 may employ one second subset, the first stacked group will have a first conductive pattern CPA, then a first insulating structure IS1 positioned on the first conductive pattern CPA, then a second conductive pattern CPB positioned on the first insulating structure IS1, and then a second insulating structure IS2 positioned on the second conductive pattern CPB. Then, the first stacked group may be repeated at least one more time.

Figure 4:
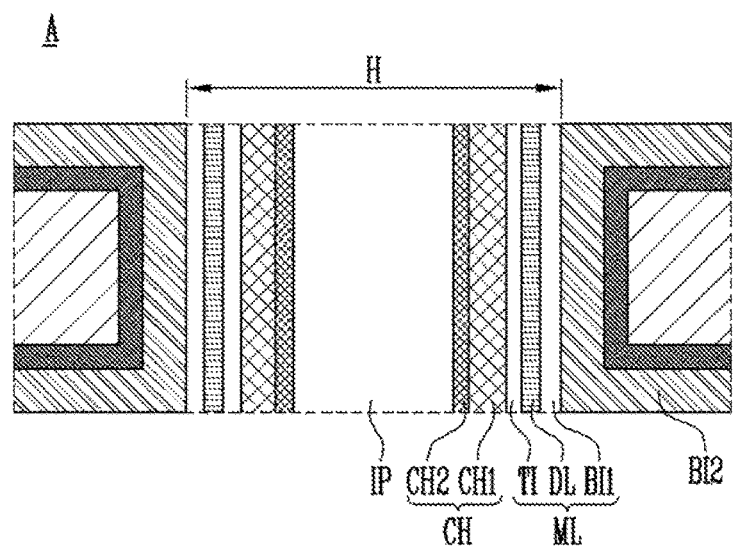
FIG. 4 is an enlarged diagram illustrating a region A indicated in FIGS. 2 and 3.

The first and second stacked bodies ST1 and ST2 may be penetrated by pillars PL. The pillars PL may be each arranged inside the holes H which penetrate the first and second stacked bodies ST1 and ST2. Each of the pillars PL may include the channel layer CH arranged inside the hole H corresponding to each pillar. The channel layer CH may extend in the extension direction of the hole H, and be surrounded by the multi-layer ML. The channel layer CH may be formed to surround an insulating pillar IP that fills the central area of the hole H. Alternatively, the channel layer CH may completely fill the central area of the hole H. The multi-layer ML may include a tunnel insulating layer, a data storing layer, and a first blocking insulating layer sequentially formed from a side wall of the channel layer CH toward a side wall of the hole H. An exemplary detailed configuration of the multi-layer ML and the channel layer CH are illustrated in FIG. 4.

The first insulating structure IS1 may induce a first stress and the second insulating structure IS2 may induce a second stress in a direction opposite to the first stress. For example, one of the first and second stresses may be a compressive stress, whereas the other may be a tensile stress. As the first and the second stress which are applied to the first and the second insulating structures IS1 and IS2, respectively, at opposite directions they may offset each other. As a result, structural distortions such as bending in each of the first and second stacked bodies ST1 and ST2 may be prevented or reduced substantially, thereby significantly improving the overall structural stability of the semiconductor device.

The first insulating structure IS1 may include an upper first stress control insulating layer TSC1, a lower first stress control insulating layer BSC1, and a first interlayer insulating layer ILD1 arranged between the upper first stress control insulating layer TSC1 and the lower first stress control insulating layer BSC1. The upper first stress control insulating layer TSC1 and the lower first stress control insulating layer BSC1 may apply a compressive stress or a tensile stress to the first interlayer insulating layer ILD1.

The upper first stress control insulating layer TSC1 and the lower first stress control insulating layer BSC1 may be formed of an oxide including a material having a different lattice constant from a material constituting a lattice structure of the first interlayer insulating layer ILD1. More specifically, an element of material layers constituting the upper first stress control insulating layer TSC1 and the lower first stress control insulating layer BSC1 may belong to the same group as an element of a material layer constituting the first interlayer insulating layer ILD1 on a periodic table, but belong to a different period. For example, the upper first stress control insulating layer TSC1, the lower first stress control insulating layer BSC1 and the first interlayer insulating layer ILD1 may each include an element of the Group 14 of the periodic table.

Specifically, the first interlayer insulating layer ILD1 may be formed of a silicon oxide. Hence, Silicon (Si) may constitute the lattice structure of the first interlayer insulating layer ILD1. The upper first stress control insulating layer TSC1 and the lower first stress control insulating layer BSC1 may be formed of a material including germanium (Ge) having a different lattice constant from silicon (Si) but belonging to the Group 14 same as silicon (Si) constituting the lattice structure of the first interlayer insulating layer ILD1. Alternatively, the upper first stress control insulating layer TSC1 and the lower first stress control insulating layer BSC1 may be formed of an oxide including carbon (C) having a different lattice constant from but belonging to the Group 14 same as silicon (Si) constituting the lattice structure of the first interlayer insulating layer ILD1.

The second insulating structure IS2 may include an upper second stress control insulating layer TSC2, a lower second stress control insulating layer BSC2, and a second interlayer insulating layer ILD2 arranged between the upper second stress control insulating layer TSC2 and the lower second stress control insulating layer BSC2. The upper second stress control insulating layer TSC2 and the lower second stress control insulating layer BSC2 may apply a compressive stress or a tensile stress to the second interlayer insulating layer ILD2.

The upper second stress control insulating layer TSC2 and the lower second stress control insulating layer BSC2 may be formed of an oxide including a material having a different lattice constant from a material constituting a lattice structure of the second interlayer insulating layer ILD2. More specifically, an element of material layers constituting the upper second stress control insulating layer TSC2 and the lower second stress control insulating layer BSC2 may belong to the same group as an element of a material layer constituting the second interlayer insulating layer ILD2 on a periodic table, but belong to a different period. For example, the upper second stress control insulating layer TSC2, the lower second stress control insulating layer BSC2 and the second interlayer insulating layer ILD2 may include an element in the Group 14 of the periodic table.

As specifically exemplified, the second interlayer insulating layer ILD2 may be formed of a silicon oxide. The upper second stress control insulating layer TSC2 and the lower second stress control insulating layer BSC2 may be formed of an oxide including germanium (Ge) having a different lattice constant from silicon (Si) but belonging to the Group 14 of the periodic table, the same as silicon (Si) constituting the lattice structure of the second interlayer insulating layer ILD2. Alternatively, the upper second stress control insulating layer TSC2 and the lower second stress control insulating layer BSC2 may be formed of an oxide including carbon (C) having a different lattice constant from but belonging to the Group 14 same as silicon (Si) constituting the lattice structure of the second interlayer insulating layer ILD2.

The upper first stress control insulating layer TSC1 and the lower first stress control insulating layer BSC1 may include an element belonging to a different period from the upper second stress control insulating layer TSC2 and the lower second stress control insulating layer BSC2. For example, the upper first stress control insulating layer TSC1 and the lower first stress control insulating layer BSC1 may be formed of an oxide including an element with a greater lattice constant than silicon of the first interlayer insulating layer ILD1. The upper second stress control insulating layer TSC2 and the lower second stress control insulating layer BSC2 may be formed of an oxide including an element with a smaller lattice constant than silicon of the second interlayer insulating layer ILD2. Accordingly, a compressive stress may be applied to the first interlayer insulating layer ILD1, and a tensile stress may be applied to the second interlayer insulating layer ILD2. In an embodiment, properties of the upper first stress control insulating layer TSC1, the lower first stress control insulating layer BSC1, the upper second stress control insulating layer TSC2 and the lower second stress control insulating layer BSC2 may be selected so that a tensile stress may be applied to the first interlayer insulating layer ILD1 and a compressive stress may be applied to the second interlayer insulating layer ILD2.

Each of the first and second conductive patterns CPA and CPB may be surrounded by a barrier metal layer BM. Each of the first conductive patterns CPA and the second conductive patterns CPB may be surrounded by a second blocking insulating layer BI12. The second blocking insulating layer BI2 may be formed to surround the barrier metal layer BM and extend to a side wall of the slit SI.

The first conductive patterns CPA and the second conductive patterns CPB may correspond to the conductive patterns CP1 to CPn described in FIGS. 1A to 1C.

Figure 3:
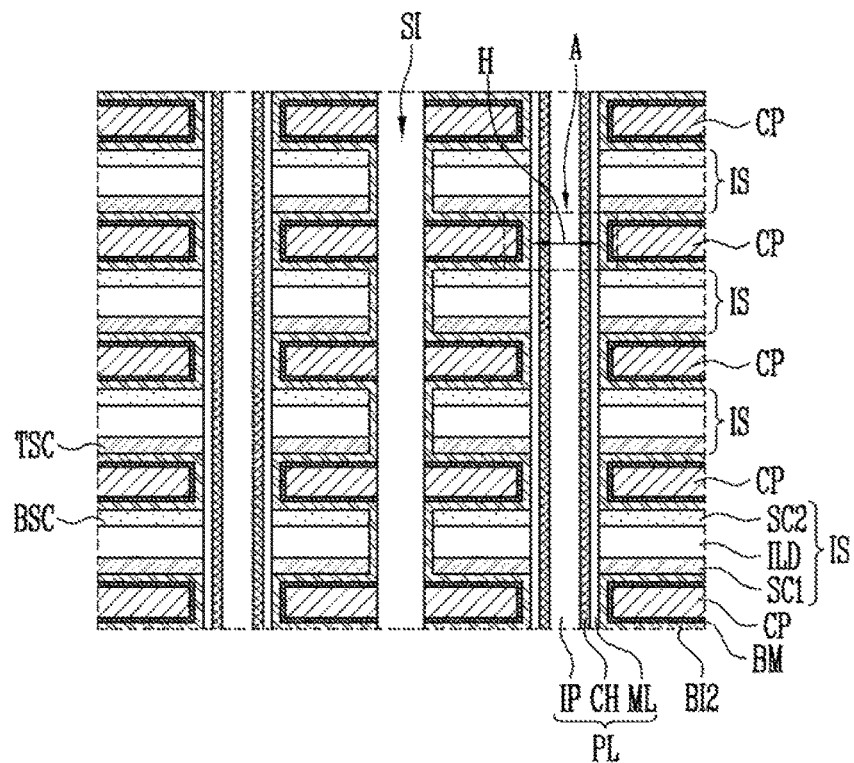
FIG. 3 is a cross-sectional diagram illustrating a semiconductor device, according to an embodiment of the present invention.

FIG. 3 is a side cross-sectional diagram illustrating a semiconductor device according to an embodiment of the present invention.

Referring to FIG. 3, the semiconductor device may include channel layers CH, insulating structures IS and conductive patterns CP alternately stacked. The insulating structures IS and conductive patterns CP may surround the channel layers CH.

The insulating structures IS and the conductive patterns CP alternately stacked may be penetrated by the slit SI and the pillars PL. Each of the pillars PL may be arranged inside the hole H which penetrates the insulating structures IS and the conductive patterns CP. Each of the pillars PL may include the channel layer CH, the insulating pillar IP and the multi-layer ML as described in FIG. 2.

Each of the insulating structures IS may include a first stress control insulating layer SC1, the interlayer insulating layer ILD, and a second stress control insulating layer SC2. The first stress control insulating layer SC1, the interlayer insulating layer ILD, and the second stress control insulating layer SC2 may surround the channel layer CH. The interlayer insulating layer ILD may be arranged between the first stress control insulating layer SC1 and the second stress control insulating layer SC2. The first stress control insulating layer SC1 may apply a first stress to the interlayer insulating layer ILD and the second stress control insulating layer SC2 may apply a second stress to the interlayer insulating layer ILD.

The first stress and the second stress may oppositely apply. One of the first stress and the second stress may be the compressive stress and the other may be the tensile stress. As the first stress and the second stress that oppositely operate are applied to the interlayer insulating layer ILD, the overall stress applied to each of the insulating structures IS may be offset. As a result, structural distortions such as bending that occur in the stacked body including the insulating structures IS and the conductive patterns CP may be prevented or reduced substantially, thereby improving the overall structural stability of the semiconductor device.

One of the first stress control insulating layer SC1 and the second stress control insulating layer SC2 may apply a compressive stress to the interlayer insulating layer ILD, and the other may apply a tensile stress to the interlayer insulating layer ILD. To this end, the first stress control insulating layer SC1, the second stress control insulating layer SC2 and the interlayer insulating layer ILD may be formed of oxide including materials having different lattice constants from one another. For example, the interlayer insulating layer ILD may be formed of a silicon oxide. One of the first stress control insulating layer SC1 and the second stress control insulating layer SC2 may be formed of an oxide including a material having a smaller lattice constant, and the other may be formed of an oxide including a material having a greater lattice constant, than silicon constituting a lattice structure of the interlayer insulating layer ILD. More specifically, one of the first stress control insulating layer SC1 and the second stress control insulating layer SC2 may be formed of an oxide including germanium (Ge) and the other may be formed of an oxide including carbon (C).

Each of the conductive patterns CP may be arranged between two consecutive insulating structures IS and arranged at different heights from each other. Specifically, each of the conductive patterns CP may be arranged between an upper stress layer TSC consisting of the first stress control insulating layer SC1 and a lower stress layer BSC consisting of the second stress control insulating layer SC2. The stress applied to the conductive patterns CP may be offset.

Each of the conductive patterns CP may be surrounded by a barrier metal layer BM and a second blocking insulating layer BI12 as described in FIG. 2. In an alternative embodiment (not shown), each of the conductive patterns CP may be surrounded by only one of the barrier metal layer BM and the second blocking insulating layer BI2. The conductive patterns CP may correspond to the conductive patterns CP1 to CPn described in FIGS. 1A to 1C.

FIG. 4 is an enlarged diagram of region A of FIGS. 2 and 3.

Referring to FIG. 4, the multi-layer ML may include a data storing layer DL, a tunnel insulating layer TI arranged between the data storing layer DL and the channel layer CH, and a first blocking insulating layer BI1 arranged between the data storing layer DL and the side wall of the hole H. The data storing layer DL, the tunnel insulating layer T1 and the first blocking insulating layer BI1 may extend along the side wall of the hole H and surround the channel layer CH. The data storing layer DL may be formed of a material layer capable of charge trap. For example, the data storing layer DL may be formed of a silicon nitride layer. The tunnel insulating layer TI may be formed of a silicon oxide layer capable of charge tunneling. The first blocking insulating layer BI1 may be formed of a material layer capable of blocking the charge.

A second blocking insulating layer BI2 may be formed of the same material as the first blocking insulating layer BI11, or of a material having a higher permittivity than the first blocking insulating layer BI1. For example, the first blocking insulating layer BI1 and the second blocking insulating layer BI2 may be formed of a silicon oxide layer. In another example, the first blocking insulating layer BI1 may be formed of a silicon oxide layer and the second blocking insulating layer BI12 may be formed of an aluminum oxide layer.

In an embodiment, one of the first blocking insulating layer BI1 and the second blocking insulating layer BI2 may be optional and not formed. For example, in an embodiment, the first blocking insulating layer BI1 is not formed, and the second blocking insulating layer BI12 may directly contact the data storing layer DL of the multi-layer ML.

The channel layer CH may be formed in a tube shape that surrounds the insulating pillar IP, but the embodiment of the present invention is not limited thereto. That is, the channel layer CH1 may be not limited to having a tube shape, but may formed in various structures.

When, for example, the channel layer CH is formed as a thin film in a tube shape surrounding the insulating pillar IP, the channel layer CH may include a first channel layer CH1 and a second channel layer CH2. The second channel layer CH2 may be formed in an inner wall of the first channel layer CH1. The first channel layer CH1 may be formed of a poly silicon layer, and the second channel layer CH2 may include an element of Group 14 of the periodic table (i.e., an element in the same group as silicon) but having a different lattice constant from silicon. For example, the second channel layer CH2 may include silicon carbide SiC or silicon germanium SiGe. Such first and second channel layers CH1 and CH2 including elements having different lattice constants may increase electron mobility in the channel layer CH.

FIGS. 5A to 5D are side cross-sectional diagrams illustrating an example of a manufacturing method of a semiconductor device illustrated in FIG. 2.

Figure 5A:
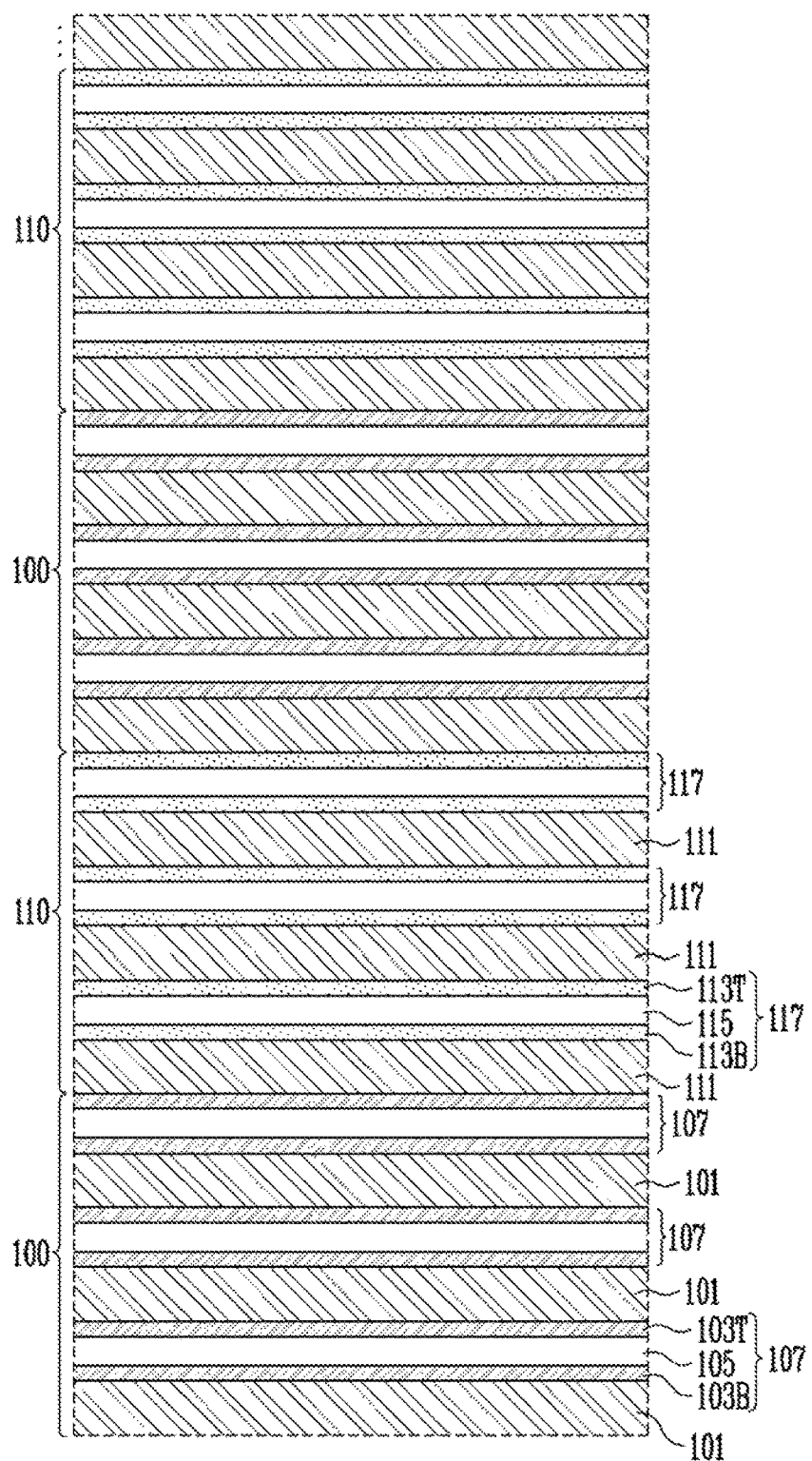

Referring to FIG. 5A, first pre-stacked bodies 100 and second pre-stacked bodies 110 may be alternately stacked over a lower structure (not shown). The lower structure may include the pipe gate PG illustrated in FIG. 1A, or the source layer SL illustrated in FIG. 1B, or a first source layer SL illustrated in FIG. 1C and a source sacrificial layer (not shown).

Each of the first pre-stacked bodies 100 may include a stacked structure of first subsets. Each of the first subsets may include a first insulating structure 107 and a first sacrificial layer 101 sequentially stacked. The first insulating structure 107 may include a lower first stress control insulating layer 103B, a first interlayer insulating layer 105, and an upper first stress control insulating layer 103T.

Each of the second pre-stacked bodies 110 may be formed in a stacked structure of second subsets. Each of the second subsets may include a second insulating structure 117 and a second sacrificial layer 111 sequentially stacked. The second insulating structure 117 may include a lower second stress control insulating layer 113B, a second interlayer insulating layer 115 and an upper second stress control insulating layer 113T sequentially stacked.

Each of the first interlayer insulating layer 105 and the second interlayer insulating layer 115 may be a silicon oxide ($SiO_2$) layer deposited by using silicon-containing gas and oxygen-containing gas.

The lower first stress control insulating layer 103B and the upper first stress control insulating layer 103T may be formed of the same material, and may be an oxide layer of an element having a different lattice constant from silicon. For example, the lower first stress control insulating layer 103B and the upper first stress control insulating layer 103T may be an oxide layer of an element belonging to a period different from silicon in the same Group 14 of the periodic table. In an embodiment, for example, the lower first stress control insulating layer 103B and the upper first stress control insulating layer 103T may be an oxide layer of germanium or carbon.

The lower second stress control insulating layer 113B and the upper second stress control insulating layer 113T may be formed of the same material, and may be an oxide layer of an element having a different lattice constant from silicon. For example, each of the lower second stress control insulating layer 113B and the upper second stress control insulating layer 113T may be an oxide layer of an element belonging to a different period from silicon in the same Group 14 of the periodic table.

Examples of properties of the lower first stress control insulating layer 103B, the upper first stress control insulating layer 103T, the lower second stress control insulating layer 113B, and the upper second stress control insulating layer 113T may be the same as described in FIG. 2.

The first insulating structure 107, the first sacrificial layer 101, the second insulating structure 117, and the second sacrificial layer 111 may be formed by alternately repeating an oxide layer deposition process and a nitride layer deposition process. Each of the first sacrificial layer 101 and the second sacrificial layer 111 may be formed by using the nitride layer deposition process. Each of the first insulating structure 107 and the second insulating structure 117 may be formed by using an oxide layer deposition process. Each of the first insulating structure 107 and the second insulating structure 117 may be formed of oxides in a multi-layer by controlling gas infiltrated into a chamber by using a mass flow controller (MFC).

For example, the lower first stress control insulating layer 103B and the upper first stress control insulating layer 103T of the first insulating structure 107 and the lower second stress control insulating layer 113B and the upper second stress control insulating layer 113T of the second insulating structure 117 may be formed by infiltrating a material having a different lattice constant from silicon in addition to silicon-containing gas and oxygen-containing gas for forming a silicon oxide layer. More specifically, the lower first stress control insulating layer 103B and the upper first stress control insulating layer 103T of the first insulating structure 107 may be formed by infiltrating first gas containing germanium atoms having a greater lattice constant than silicon into the chamber, in addition to the silicon-containing gas and the oxygen-containing gas for forming a silicon oxide layer. The lower second stress control insulating layer 113B and the upper second stress control insulating layer 113T of the second insulating structure 117 may be formed by infiltrating second gas containing carbon atoms having a smaller lattice constant than silicon into the chamber, in addition to the silicon containing-gas and the oxygen-containing gas for forming a silicon oxide layer.

In another example, to form the lower first stress control insulating layer 103B and the upper first stress control insulating layer 103T of the first insulating structure 107, the above-described second gas (e.g., carbon-containing gas) may be infiltrated into the chamber, in addition to silicon-containing gas and oxygen-containing gas. To form the lower second stress control insulating layer 113B and the upper second stress control insulating layer 113T of the second insulating structure 117, the above-described first gas (e.g., germanium-containing gas) may be infiltrated into the chamber, in addition to silicon-containing gas and oxygen-containing gas.

The first interlayer insulating layer 105 of the first insulating structure 107 and the second interlayer insulating layer 115 of the second insulating structure 117 may block the first and second gases from being infiltrated, but be formed by infiltrating the silicon-containing gas and the oxygen-containing gas into the chamber. The silicon-containing gas may include silane ($SiH_4$).

A stress control insulating layer based on the first gas may be formed of a germanium compound. The germanium compound may include at least one of germanium dioxide ($GeO_2$), a material having a chemical formula $Ge_xO_y$, and a chemical compound including elements of silicon, germanium and oxide (Si—Ge—O). In such a case, the first gas may include germane ($GeH_4$). The first gas may further include oxygen-containing gas. The oxygen-containing gas may include oxygen ($O_2$) or nitrous oxide ($N_2O$). The first gas may further include silicon-containing gas. The silicon-containing gas may include silane ($SiH_4$). A chemical compound of Si—Ge—O may coexist in the stress control insulating layer with $GeO_2$ or $Ge_xO_y$.

A stress control insulating layer based on the second gas may be formed of a carbon compound. The carbon compound may include at least one of a material having a chemical formula 2SiC, a material having a chemical formula 3SiC, a material having a chemical formula xSiC, and a chemical compound including elements of hydrogen, silicon and carbon (H—Si—C). For example, when the second gas includes a mixture gas of $2SiH_4$ and $C_2H_2$, a carbon compound of 2SiC and a chemical compound of H—Si—C may coexist in the stress control insulating layer. In an alternative embodiment, when the second gas includes a mixture gas of $3SiH_4$ and $C_3H_2$, a carbon compound of 3SiC and a chemical compound of H—Si—C may coexist in the stress control insulating layer.

The stress control insulating layer based on the first gas or the second gas may be formed under a temperature range from 400° C. to 750° C.

Referring to FIG. 5B, the first and second pre-stacked bodies 100 and 110 may be etched to form the holes H penetrating therethrough. Pillars 120 may be formed inside each of the holes H.

Forming the pillars 120 may include forming a multi-layer 121 on each surface of the holes H and forming a channel layer 123 on the multi-layer 121. The multi-layer 121 may be formed by sequentially stacking the first blocking insulating layer BI1, the data storing layer DL, and the tunnel insulating layer TI, which are described with reference to FIG. 4, on the side wall of the holes H.

The channel layer 123 may be formed of a semiconductor layer, for example, the channel layer 123 may include a silicon layer. The channel layer 123 may be formed in a tube shape in the central area of each of the holes H. To increase mobility of the charge in the channel layer 123, the channel layer 123 may include the first channel layer CH1 and the second channel layer CH2 including the elements having different lattice constants as described in FIG. 4. The central area of each of the holes H may be filled with an insulating pillar 125.

By etching the first pre-stacked bodies 100 and the second pre-stacked bodies 110, the slit 131 may be formed to penetrate therethrough. The slit 131 may be formed by etching the first and second pre-stacked bodies 100 and 110 between the pillars PS.

Referring to FIG. 5C, the first and second sacrificial layers (101 and 111 of FIG. 5A) may be selectively removed by the slit 131. Openings 133 may be defined between the insulating structures 107 and 117 adjacent to each other.

Figure 5D:
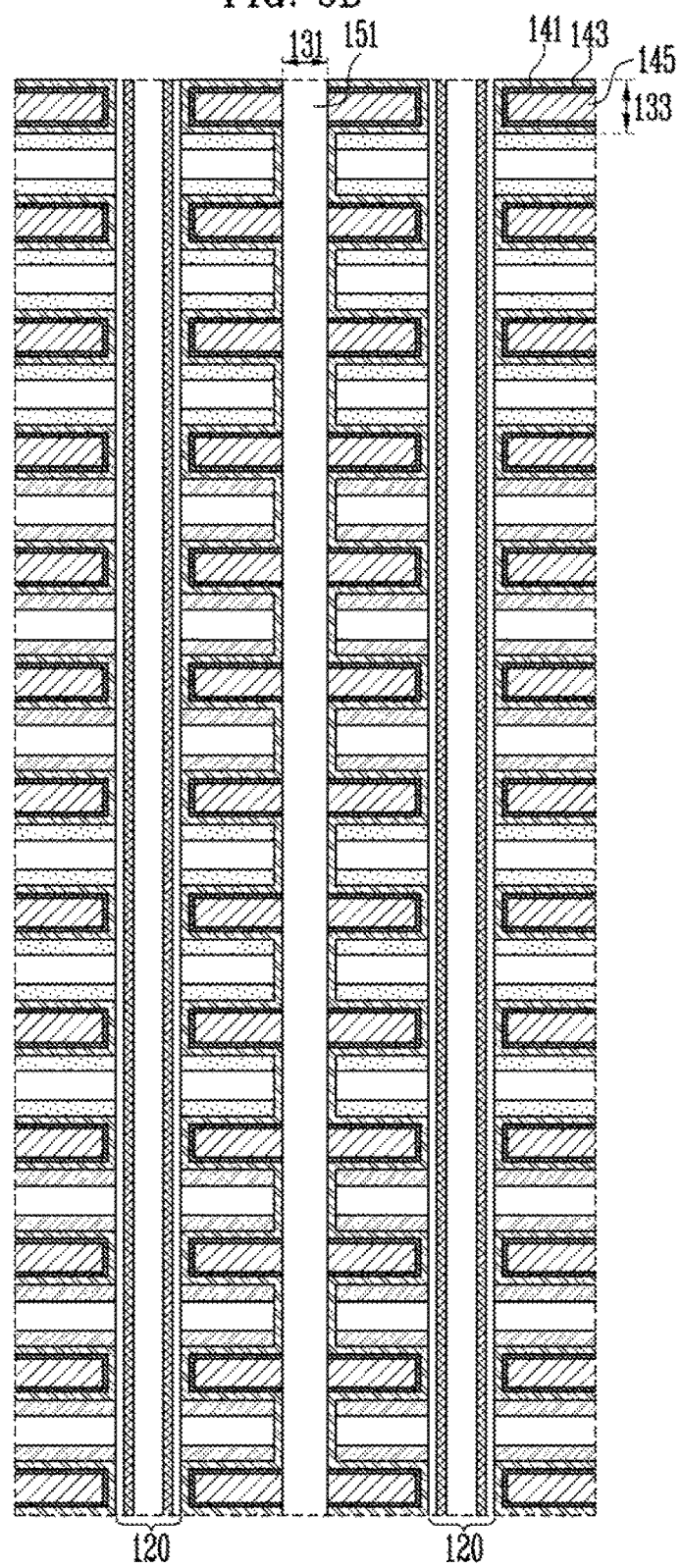

Referring to FIG. 5D, a second blocking insulating layer 141 may be formed on surfaces of the openings 133. The second blocking insulating layer 141 may extend on the side wall of the slit 131. A barrier metal layer 143 may be formed on the surface of each of the openings 133. The barrier metal layer 143 may be formed on the second blocking insulating layer 141. Subsequently, conductive patterns 145 filling inside the openings 133 may be formed. The conductive patterns 145 may be formed of various conductive materials. For example, the conductive patterns 145 may include a metal with low resistance. Each of the conductive patterns 145 may be formed on the barrier metal layer 143.

Subsequently, a slit insulating layer 131 filling the slit 131 may be formed.

Figure 6A:
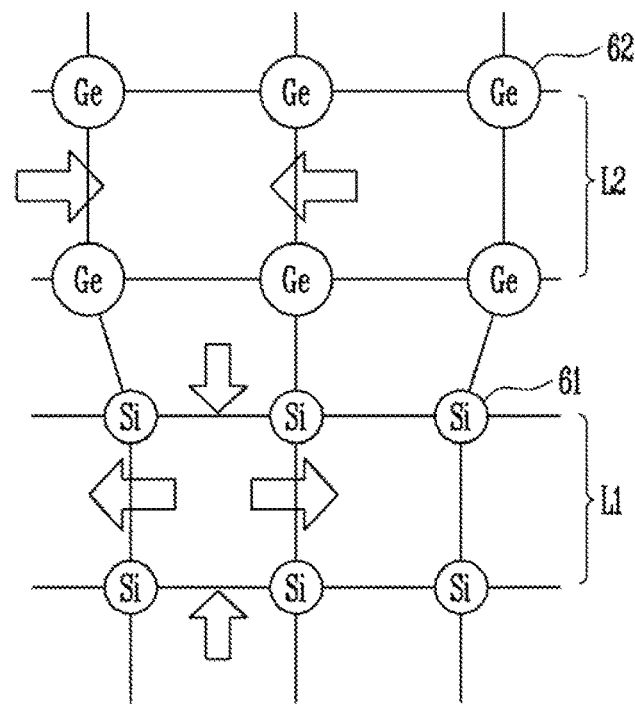
FIGS. 6A and 6B are diagrams illustrating stress applied to material layers having different lattice structures.
Figure 6B:
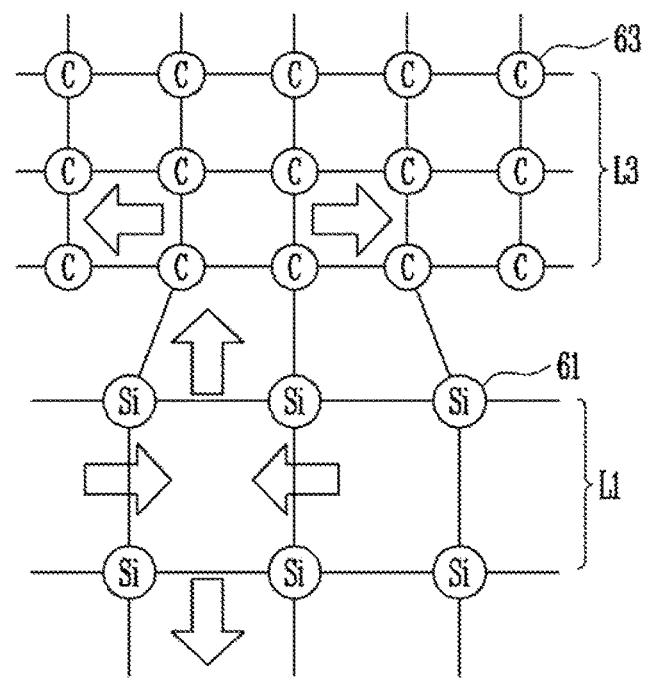

FIGS. 6A and 6B are diagrams illustrating stress applied to material layers having different lattice structures.

Referring to FIG. 6A, an insulating structure including a first material layer L1 and a second material layer L2 may be provided. A first atom 61 of the first material layer L1 and a second atom 62 of the second material layer L2 may be atoms of elements of the Group 14 on the periodic table, but of a different period. More specifically, a lattice constant of the first atom 61 may be greater than a lattice constant of the second atom 62. For example, the first atom 61 may be silicon (Si) and the second atom 62 may be germanium (Ge).

Due to a difference between the lattice constants of the first atom 61 and the second atom 62 as described above, the stress may be applied in directions indicated by the arrows. The first material layer L1 may experience the compressive stress. When the first material layer L1 is used as the interlayer insulating layer and the second material layer L2 is used as the stress control insulating layer in the insulating structure, a compressive stress may be applied to the interlayer insulating layer.

Referring to FIG. 6B, an insulating structure including the first material layer L1 and a third material layer L3 may be provided. The first atom 61 of the first material layer L1 and a third atom 63 of the third material layer L3 may belong to the Group 14 but belong to a different period of the periodic table. More specifically, the lattice constant of the first atom 61 may be smaller than a lattice constant of the third atom 63. For example, the first atom 61 may be silicon (Si) and the third atom 63 may be carbon (C).

Due to a difference between the lattice constants of the first atom 61 and the third atom 63 described above, the stress may be applied in directions indicated by arrows. The first material layer L1 may experience the tensile stress. When the first material layer L1 is used as the interlayer insulating layer and the third material layer L3 is used as the stress control insulating layer in the insulating structure, a tensile stress may be applied to the interlayer insulating layer.

As described in FIGS. 6A and 6B, the stress may be induced in various directions to the interlayer insulating layer due to the lattice constant difference.

According to a principle described in FIGS. 6A and 6B, the first stress and the second stress that oppositely operate to the first insulating structures IS1 and 107 and the second insulating structures IS2 and 117 described in FIG. 2 and FIGS. 5A to 5D may be induced.

Figure 7A:
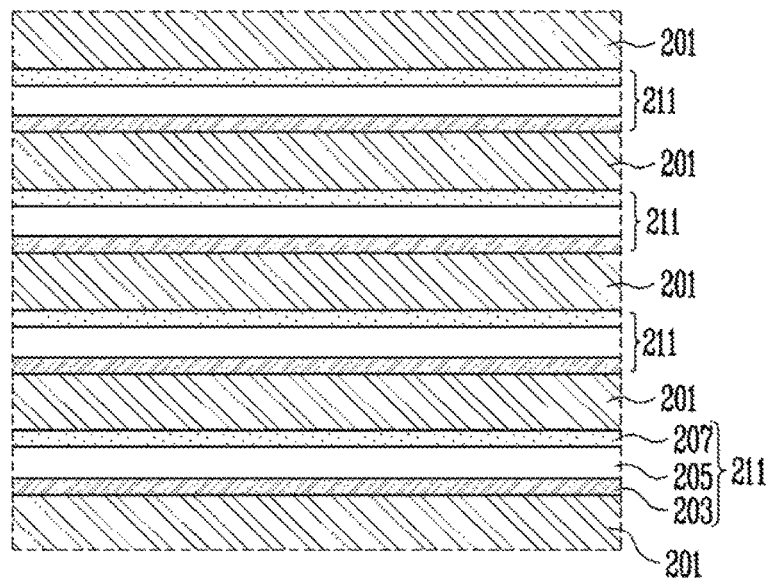
FIGS. 7A and 7B are cross-sectional diagrams illustrating a manufacturing method of the semiconductor device shown in FIG. 3, according to an embodiment of the present invention.
Figure 7B:
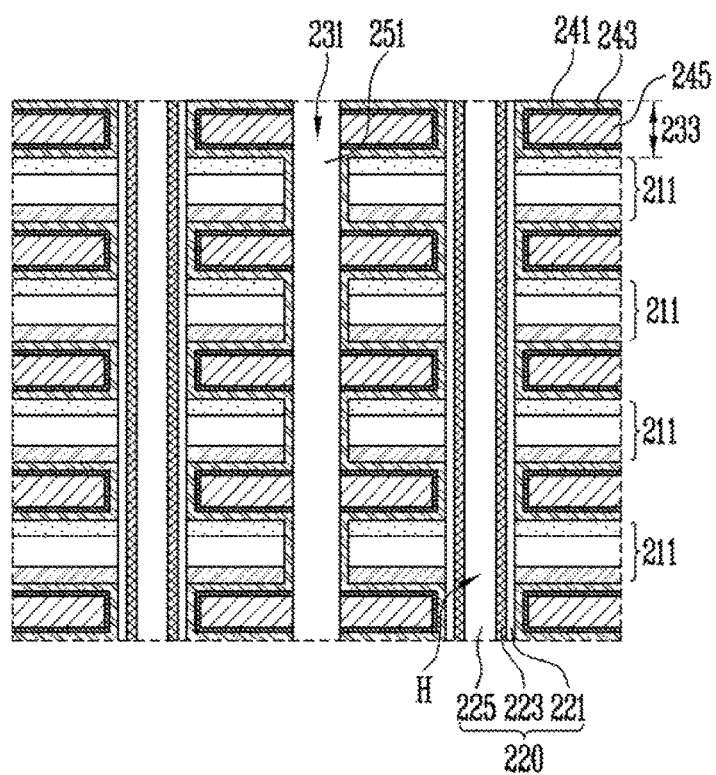

FIGS. 7A and 7B are cross-sectional diagrams illustrating an example of a manufacturing method of the semiconductor device shown in FIG. 3

Referring to FIG. 7A, sacrificial layers 201 and insulating structures 211 may be alternately stacked over a lower structure (not shown). The lower structure may include the pipe gate PG illustrated in FIG. 1A or the source layer SL illustrated in FIG. 1B. Alternatively, the lower structure may include the first source layer SL illustrated in FIG. 1C and the source sacrificial layer (not shown).

An insulating structure 211 may include a first stress control insulating layer 203, an interlayer insulating layer 205, and a second stress control insulating layer 207 sequentially stacked. The interlayer insulating layer 205 may be a silicon oxide ($SiO_2$) layer deposited by using silicon-containing gas and oxygen-containing gas.

The first stress control insulating layer 203 and the second stress control insulating layer 207 may be oxide layers including a material having a different lattice constant from silicon. For example, each of the first stress control insulating layer 203 and the second stress control insulating layer 207 may be a layer of an oxide of an element from a different period of the periodic table than silicon but from the same Group 14 as silicon.

Examples of the properties of the first stress control insulating layer 203 and the second stress control insulating layer 207 may be the same as described with reference to FIG. 3.

The insulating structures 211 and the sacrificial layers 201 may be formed by alternately repeating the oxide layer deposition and the nitride layer deposition. Each of the sacrificial layers 201 may be formed by performing the nitride layer deposition. Each of the insulating structures 211 may be formed by performing the oxide layer deposition. Each of the insulating structures 211 may include oxides in a multilayer. The oxides in the multilayer are formed by controlling gas infiltrated into a chamber by using a mass flow controller (MFC).

For example, the first stress control insulating layer 203 and the second stress control insulating layer 207 of each insulating structure 211 may be formed by infiltrating a material having a different lattice constant from silicon in a gas state, in addition to the silicon-containing gas and the oxygen-containing gas for silicon oxide layer. More specifically, the first stress control insulating layer 203 may be formed by infiltrating a first gas including germanium atoms, into the deposition chamber, in addition to the silicon-containing gas and the oxygen-containing gas. The second stress control insulating layer 207 may be formed by infiltrating a second gas including carbon atoms into the deposition chamber, in addition to for the silicon-containing gas and the oxygen-containing gas.

In another example, to form the first stress control insulating layer 203, the second gas described above (e.g., carbon-containing gas) may be infiltrated into the chamber in addition to the silicon-containing gas and the oxygen-containing gas. To form the second stress control insulating layer 207, the first gas described above (e.g., germanium-containing gas) may be infiltrated into the chamber in addition to the silicon-containing gas and the oxygen-containing gas.

The interlayer insulating layer 205 may block the first gas and the second gas from being infiltrated, and be formed by infiltrating the silicon-containing gas and the oxygen-containing gas into the chamber. The silicon-containing gas may include silane ($SiH_4$) gas.

Referring to FIG. 7B, formed may be the holes H, pillars 220 each including a multilayer 221, a channel layer 223, an insulating pillar 225 inside the holes H, a slit 231, openings 233, a second blocking insulating layer 241, a barrier metal layer 243, conductive patterns 245, and a slit insulating layer 231, as described with reference to FIGS. 5B to 5D.

According to the principle described in FIGS. 6A and 6B. The first and second stress may be induced to the insulating structures IS and 211 described with reference to FIGS. 7A and 7B to work in the directions opposite to each other. Accordingly, process stress applied to an alternately stacked structure of the sacrificial layer and the insulating structure or an alternately stacked structure of the conductive pattern and the insulating structure may be reduced. In addition, stress of the insulating structure IS and 211 may be reduced. Further, process stress applied due to the deposition process and the cleaning process repeated during forming the barrier metal layer 243 and the conductive pattern 245 in each of the openings 233 between the insulating structures 211 may be reduced.

FIGS. 8A to 8D are cross-sectional diagrams illustrating the semiconductor device and the manufacturing method thereof according to an embodiment of the present invention. The processes described in FIGS. 8A to 8D may be performed in a wafer (not shown) including a cell area CA and a contact area CTA. The memory string including at least one of the structures described in FIGS. 1A to 1C may be arranged in the cell area CA. The conductive patterns described in FIG. 1A to 1C may be patterned in the stair structure in the contact area CTA.

Figure 8A:
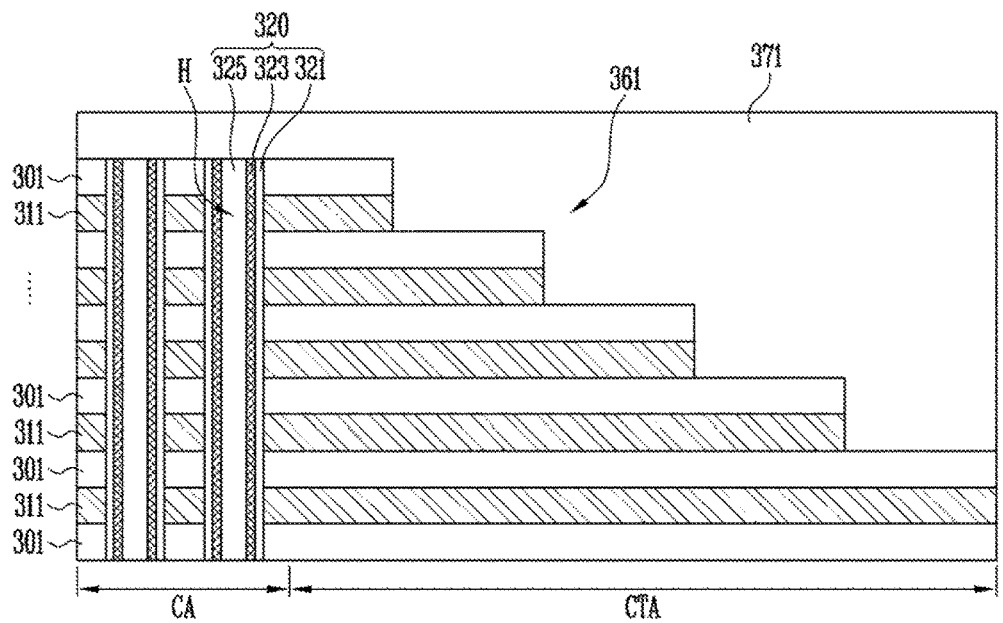
FIGS. 8A to 8D are cross-sectional diagrams illustrating a semiconductor device and a manufacturing method thereof, according to an embodiment of the present invention.

Referring to FIG. 8A, although not shown, a lower structure may be formed in advance on the wafer including the cell area CA and the contact area CTA. The lower structure may include transistors constituting a driving circuit. The lower structure may include the pipe gate PG illustrated in FIG. 1A, the source layer SL illustrated in FIG. 1B, or the first source layer SL and the source sacrificial layer (not shown).

Subsequently, an interlayer insulating layer 301 and a sacrificial layer 311 may be alternately stacked in the lower structure. The interlayer insulating layer 301 may be formed of a silicon oxide layer and the sacrificial layer 311 may be formed of a nitride layer.

Then, formed may be the holes H penetrating the interlayer insulating layer 301 and the sacrificial layers 311, and pillars 320 including a multi-layer 321, a channel layer 323, and an insulating pillar 325 inside the holes H. The forming of the pillars 320 may be the same as described with reference to FIG. 5B.

A stair structure 361 may be formed on the contact area CTA of the wafer by etching the interlayer insulating layers 301 and the sacrificial layers 311.

The Interlayer insulating layer 301 and the sacrificial layer 311 including an end portion constituting the stair structure 361 may be covered by a planarization insulating layer 371.

Figure 8B:
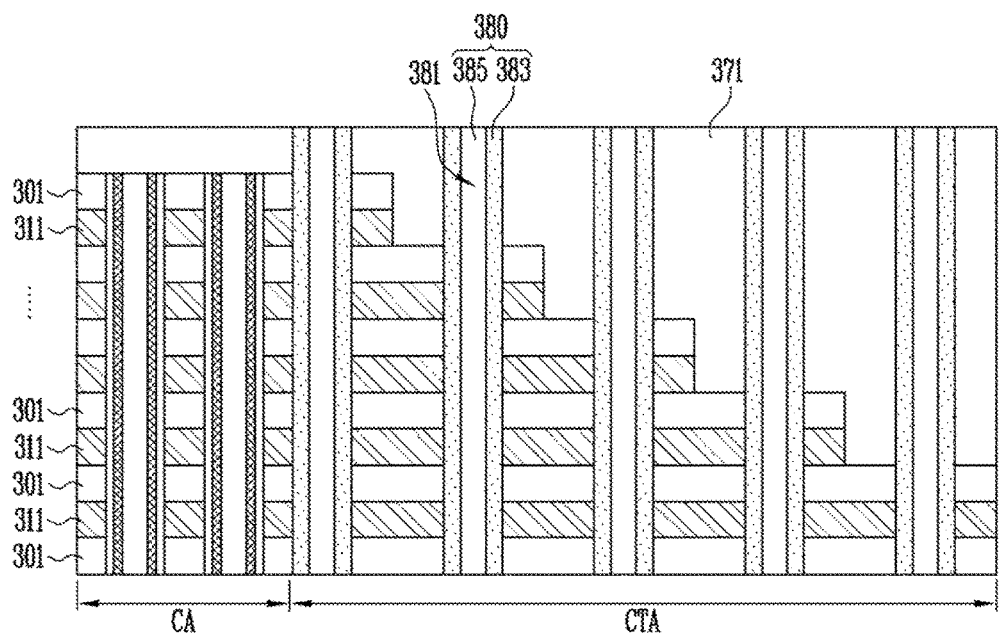

Referring to FIG. 8B, penetrating areas 381 may be formed to penetrate the planarization insulating layer 371, the interlayer insulating layers 301 and the sacrificial layers 311 on the contact area CTA. The penetrating areas 381 may be formed in a hole type. Support pillars 380 filling the penetrating areas 381 may be formed.

Each of the support pillars 380 may include a core pattern 385 and a stress control pattern 383 surrounding the core pattern 385. The stress control pattern 383 may be formed on a side wall of each penetrating area 381, and the core pattern 385 may fill a central area of each penetrating area 381 and be formed on the stress control pattern 383.

The core pattern may be a silicon oxide ($SiO_2$) layer. The stress control pattern 383 may be an oxide including a material having a different lattice constant from silicon constituting a lattice structure of the core pattern 385. For example, the stress control pattern 383 may be formed of an oxide including germanium (Ge) or an oxide including carbon (C).

The support pillars 380 may be formed simultaneously with a block slit insulating layer (not shown) to divide the interlayer insulating layers 301 and the sacrificial layers 311 into the memory blocks.

Figure 8C:
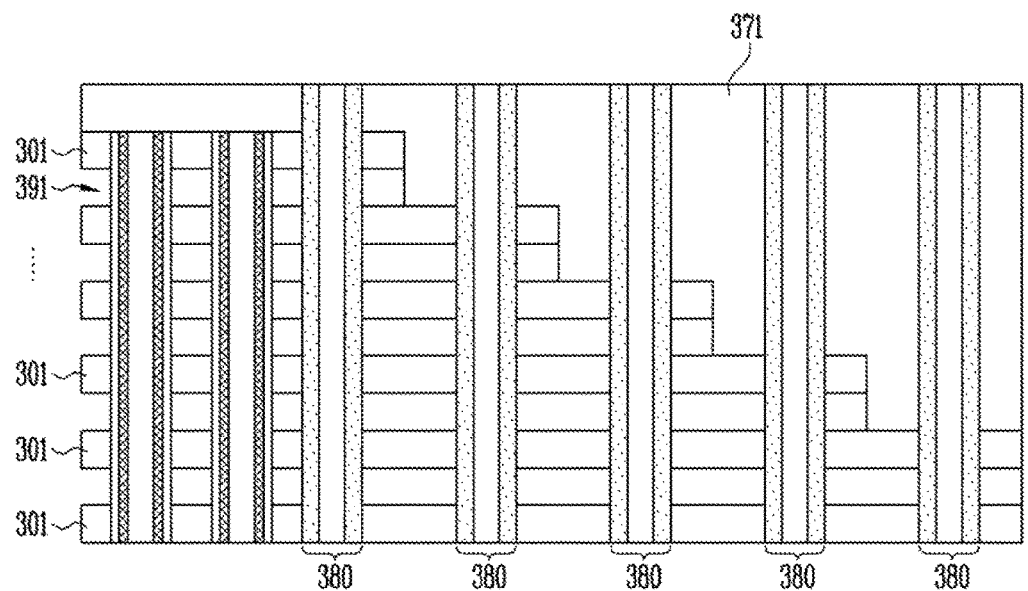

Referring to FIG. 8C, after forming the slits penetrating the interlayer insulating layers 301 and the sacrificial layers 311 divided into the memory blocks, the sacrificial layers 311 may be selectively removed. Openings 391 may be formed between the interlayer insulating layers 301 by removing the sacrificial layers 311. The support pillars 380 may stably support the interlayer insulating layers 301.

Figure 8D:
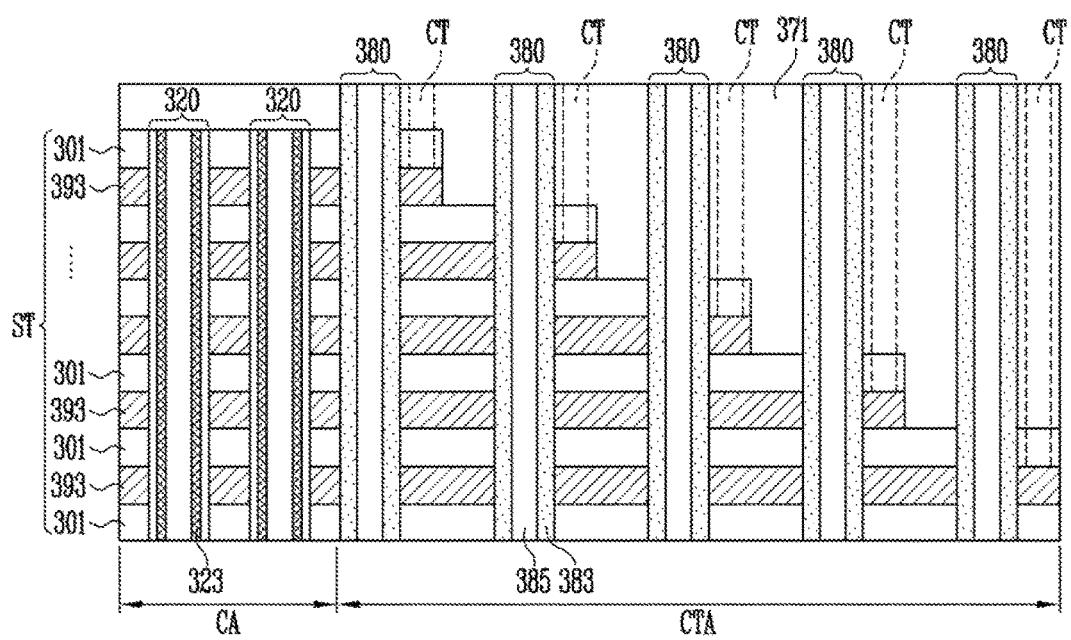

Referring to FIG. 8D, openings 391 may be filled with conductive patterns 393. Subsequently, contact plugs CT contacting each of the conductive patterns 393 by penetrating at least one of the planarization insulating layer 371 and the interlayer insulating layers 301 may be formed. The contact plugs CT are shown in a dot line because the contact plugs CT are not arranged on the same vertical plane as the cutting cross-section of FIG. 8D. The contact plugs CT may be arranged to be crossed the support pillars 380. The contact plugs CT may be formed of a conductive material.

The semiconductor device formed by the processes described with reference to FIGS. 8A to 8D may include the pillars 320 including the channel layer 323, a stacked body ST surrounding the pillars 320 and the support pillars 380 penetrating the stacked body ST.

The stacked body ST may include the interlayer insulating layer 301 and the conductive patterns 393 alternately stacked. The interlayer insulating layers 301 and the conductive patterns 393 of the stacked body ST may be stacked to form a stair structure. The stacked structure ST may be divided into the cell area CA and the contact area CTA. The contact area CTA of the stacked body ST may be formed of end portions of the interlayer insulating layers 301 and the conduct patterns 393 extending from the cell area CA. The interlayer insulating layers 301 and the conductive patterns 393 may be formed in the stair structure in the contact area CTA. The conductive patterns 393 of the stacked body ST may be used as the conductive patterns described with reference to FIGS. 1A to 1C.

The pillars 320 including the channel layer 323 may be arranged in the cell area CA of the stacked body ST. The support pillars 380 may be arranged in the contact area CTA of the stacked body ST. The support pillars 380 may penetrate the stair structure of the stacked body ST.

Each of the support pillars 380 may include a core pattern 385 and a stress control pattern 383 surrounding the core pattern 385. Material layers constituting the core patterns 385 and the stress control pattern 383 may be selected to apply the compressive stress or the tensile stress to the core pattern 385.

The compressive stress or the tensile stress applied to the core pattern 385 may work in a direction to reduce the stress generated during the processes described with reference to FIGS. 8A to 8D, thereby reducing distortion of the stacked body ST.

The core pattern 385 may be formed of an oxide including silicon and the stress control pattern 383 may be formed of an oxide including an atom having a different lattice constant from silicon. For example, the stress control pattern 383 may be formed of an oxide including germanium or an oxide including carbon. Accordingly, the compressive stress according to the principle described with reference to FIG. 6A or the tensile stress according to the principle described with reference to FIG. 6B may be applied to the core pattern 385 of each support pillars 380.

Figure 9:
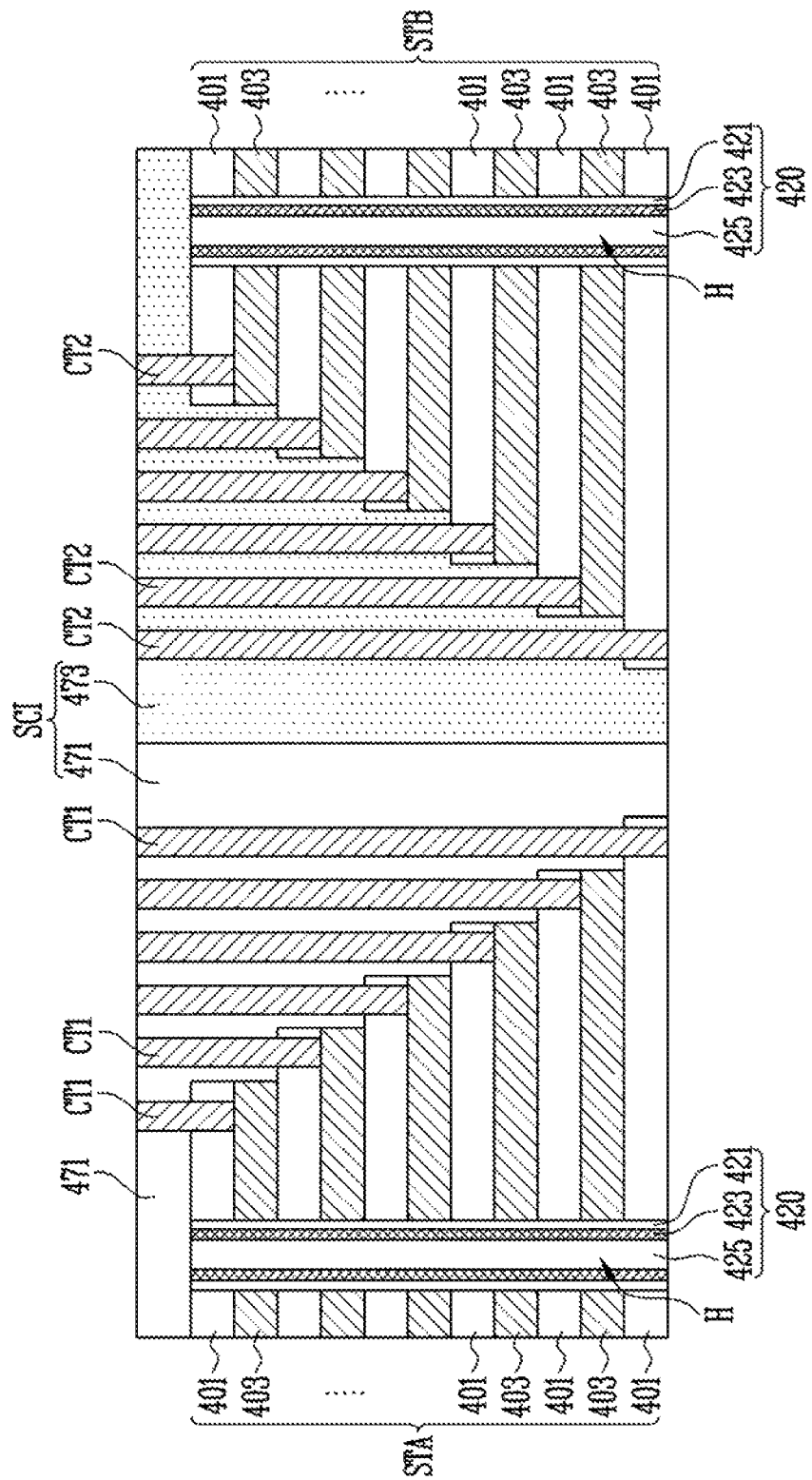
FIG. 9 is a cross-sectional diagram illustrating a semiconductor device and a manufacturing method thereof according to an embodiment of the present invention.

FIG. 9 is a cross-sectional diagram illustrating the semiconductor device and the manufacturing method thereof according to an embodiment of the present invention Referring to FIG. 9, the semiconductor device may include a first staked body STA and a second stacked body STB spaced apart from each other. Each of the first stacked body STA and the second stacked body STB may be formed by using the processes described with reference to FIGS. 8A to 8D.

Each of the first stacked body STA and the second stacked body STB may include interlayer insulating layers 401 and conductive patterns 403 alternately stacked. The interlayer insulating layers 401 and the conductive patterns 403 may be form a stair structure at an end portion of each of the first stacked body STA and the second stacked body STB. The conductive patterns 403 may be used as the conductive patterns described with reference to FIGS. 1A to 1C.

Each of the first stacked body STA and the second stacked body STB may be penetrated by a pillar 420. The pillar 420 may be arranged inside the hole H extending to penetrate the first stacked body STA and the second stacked body STB. The pillar 420 may include a channel layer 423 arranged inside the hole H. The channel layer 423 may extend in an extension direction of the hole H, and be surrounded by a multi-layer 421. The channel layer 423 may be formed to surround an insulating pillar 425 filling the central area of the hole H. Detailed configurations of the multi-layer 421 and the channel layer 423 may be the same as described with reference to FIG. 4.

A space between the first stacked body STA and the second stacked body STB may be filled with the stress control insulating layer SCI. The stress control insulating layer SCI may include a first material layer 471 arranged closer to the first stacked body STA than the second stacked body STB, and a second material layer 473 arranged closer to the second stacked body STB than the first stacked body STA. The first stacked body STA and the second stacked body STB may be formed in a symmetrical stair structure about the stress control insulating layer SCI.

A forming process of the stress control insulating layer SCI may be divided into a forming process of the first material layer 471 and a forming process of the second material layer 473.

The first material layer 471 may be formed to completely fill the space between the first stacked body STA and the second stacked body STB after forming the first stacked body STA and the second stacked body STB having a symmetrical stair structure. The first material layer 471 may be partially removed by an etching process using a mask pattern (not shown) as an etching barrier. The first material layer 471 may be etched to expose the second stacked body STB and a portion of the space between the first stacked body STA and the second stacked body STB. The portion of the space may be adjacent to the second stacked body STB. The first material layer 471 may remain in the structure illustrated in FIG. 9.

The mask pattern may be removed. The second material layer 473 may be formed to completely fill a space between remaining portion of the first material layer 471 and the second stacked body STB.

The first material layer 471 may be formed to cover the first stacked body STA, and the second material layer 473 may be formed to cover the second stacked body STB. The first material layer 471 and the second material layer 473 may be planarized.

After forming the stress control insulating layer SCI including the first material layer 471 and the second material layer 473, the first and second contact plugs CT1 and CT2 penetrating the stress control insulating layer SCI may be formed. The first contact plugs CT1 may extend to penetrate the first material layer 471 and contact the conductive patterns 403 of the first stacked body STA. The second contact plugs CT2 may extend to penetrate the second material layer 473 and contact the conductive patterns 403 of the second stacked body STB. The first contact plugs CT1 and the second contact plugs CT2 may be formed of a conductive material.

The stress control insulating layer SCI may be formed to apply stress toward one of the first stacked body STA and the second stacked body STB, and a stress direction of the stress control insulating layer SCI may be controlled according to a lattice constant difference between the first material layer 471 and the second material layer 473.

The first material layer 471 and the second material layer 473 may be formed of an oxide including materials having different lattice constants from each other. For example, the first material layer 471 may be formed of a silicon oxide, and the second material layer 473 may be formed of an oxide having a different lattice constant from silicon. In such a case, the second material layer 473 may be formed of an oxide including germanium having a greater lattice constant than silicon or an oxide including carbon having a smaller lattice constant than silicon.

Due to a lattice constant difference between the first material layer 471 and the second material layer 473, the stress control insulating layer SCI may apply the stress toward the first stacked body STA or the second stacked body STB. The stress direction of the stress control insulating layer SCI may be determined in consideration of the stress direction applied to the wafer during a manufacturing process of the semiconductor device.

An edge of the wafer may experience the process stress toward one direction while manufacturing the memory device of the semiconductor device. In an embodiment of the present invention, properties of the first material layer 471 and the second material layer 473 may be selected so that the stress control insulating layer SCI may have the stress toward the direction opposite to the process stress applied to the edge of the wafer. As a result, in the embodiment of the present invention, the process stress applied to the wafer may be offset by using the stress control insulating layer SCI. Therefore, in the embodiment of the present invention, distortion of the first stacked body STA and the second stacked body STB may be prevented.

As described above, in the embodiments of the present invention, the distortion of the stacked body constituting the semiconductor device may be prevented by differently determining a position of the stress control insulating layer or the stress control pattern to generate the stress in a desired direction. As a result, in the embodiments of the present invention, alignment of the contact plugs arranged on the stacked body may be improved. In addition, in the embodiments of the present invention, the structural stability of the semiconductor device may be improved.

Figure 10:
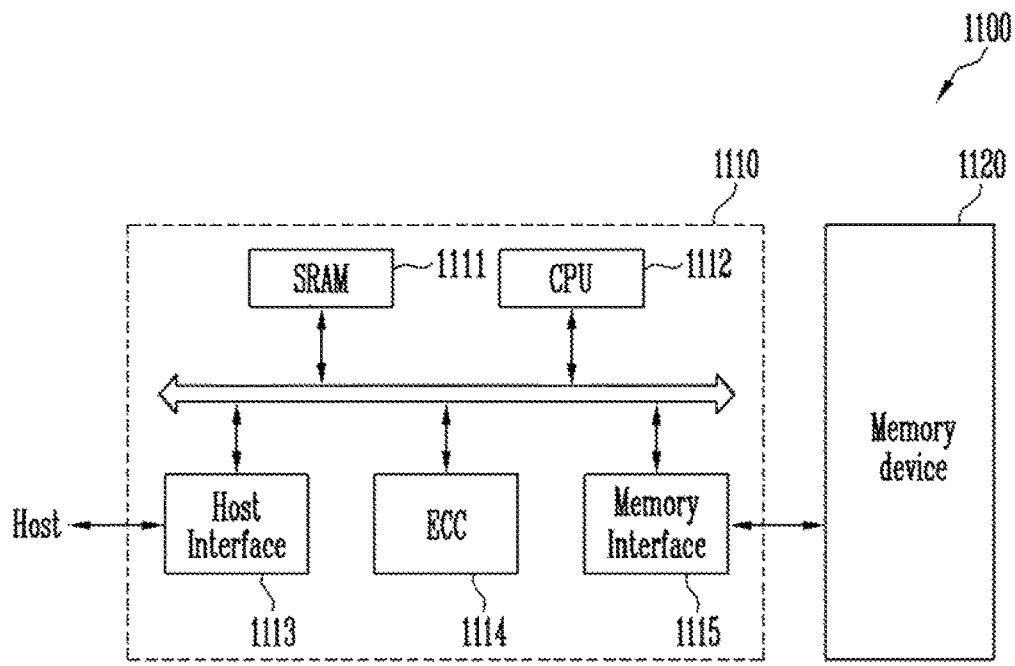
FIG. 10 is a block diagram illustrating a memory system, according to an embodiment of the present invention.

FIG. 10 is a block diagram illustrating a memory system according to an embodiment of the present invention.

Referring to FIG. 10, the memory system 1100 according to the embodiment of the present invention may include a memory device 1120 and a memory controller 1110.

The memory device 1120 may include the insulating structures described in FIG. 2 or FIG. 3. That is, the insulating structures of the memory device 1120 may include stress control insulating layers applying the first stress and the second stress toward the directions opposite to each other. Alternatively, the memory device 1120 may include the support pillars described in FIG. 8D. In other words, each support pillar of the memory device 120 may include the stress control pattern surrounding the core pattern to apply the stress to the core pattern. Alternatively, the memory device 1120 may include the stress control insulating layer having the stress applied in the direction where the process stress is offset as described in FIG. 9. The stress control insulating layer may fill the spaces between the first stacked body and the second stacked bodies spaced apart from each other.

The memory device 1120 may be a multi-chip package consisting of a plurality of flash memory chips.

The memory controller 1110 may be configured to control the memory device 1120, and include a static random access memory (SRAM, 1111), CPU 1112, host interface 1113, an error correction code 1114, and memory interface 1115. The SRAM 1111 may be used as an operational memory of the CPU 1112, the CPU 1112 may perform a general control operation for exchanging data of the memory controller 1110, and the host interface 1113 may include a data exchange protocol of the host contacting the memory system 1100. In addition, the ECC 1114 may detect and correct an error included in the data read from the memory device 1120, and the memory interface 1115 may perform interfacing with the memory device 1120. Further, the memory controller 1110 may include a read only memory (ROM) storing code data for interfacing with the host.

The memory system 1100 may be a memory card of a solid state disk (SSD) in which the memory device 1120 and the controller 1100 are combined. For example, when the memory controller 1100 is a SSD, the memory controller 1110 may communicate with an external source (e.g. a host) through one of various interface protocols such as universal serial bus (USB), multimedia card (MMC), peripheral component interconnection-express (PCI-E), serial advanced technology attachment (SATA), parallel advanced technology attachment (PATA), small computer small interface (SCSI), enhanced small disk interface (ESDI), and integrated drive electronics (IDE).

Figure 11:
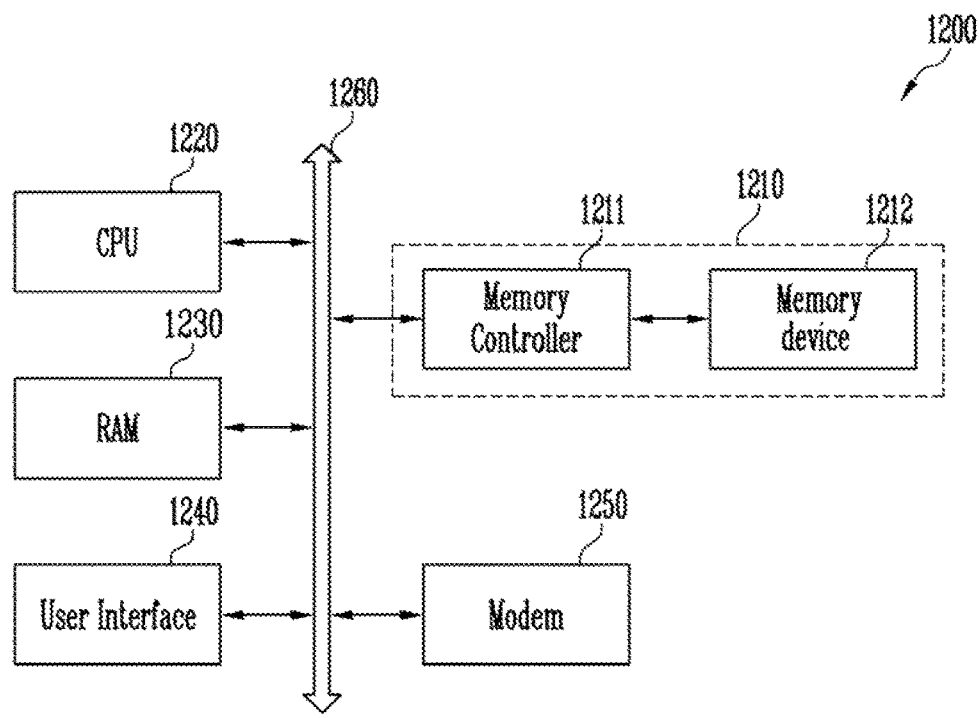
FIG. 11 is a block diagram illustrating a computing system including the memory system of FIG. 10, according to an embodiment of the present invention.

FIG. 11 is a block diagram illustrating a computing system including a memory system described in reference to FIG. 10.

Referring to FIG. 11, the computing system 1200 according to an embodiment of the present invention may include CPU 1220, a random access memory (RAM, 1230), user interface 1240, modem 1250, and a memory system 1210 electrically connected to system bus 1260. In addition, when the computing system 1200 is a mobile device, a battery may be further included to provide an operation voltage to the computing system 1200, and application chipset, a camera image processor (CIS), and a mobile dynamic random access memory (DRAM) and the like may be further included.

The memory system 1210 may include a memory device 1212 and a memory controller 1211 as described in reference to FIG. 10.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
   a first stacked body including at least one first sub-set, in which a first conductive pattern and a first insulating structure are stacked;
   a second stacked body arranged on the first stacked body and including at least one second sub-set, in which a second conductive pattern and a second insulating structure are stacked; and
   a channel layer penetrating the first stacked body and the second stacked body;
   wherein the first insulating structure induces a first stress and the second insulating structure induces a second stress in a direction opposite to the first stress,
   wherein the first insulating structure includes an upper first stress control insulating layer, a lower first stress control insulating layer, and a first interlayer insulating layer arranged between the upper first stress control insulating layer and the lower first stress control insulating layer,
   wherein the second insulating structure includes an upper second stress control insulating layer, a lower second stress control insulating layer, and a second interlayer insulating layer arranged between the upper second stress control insulating layer and the lower second stress control insulating layer,
   wherein the upper first stress control insulating layer and the lower first stress control insulating layer are formed of an oxide including a material having a different lattice constant from silicon constituting a lattice structure of the first interlayer insulating layer, and wherein the upper second stress control insulating layer and the lower second stress control insulating layer are formed of an oxide including a material having a different lattice constant from silicon constituting a lattice structure including the second interlayer insulating layer.

2. The semiconductor device of claim 1,
wherein two or more stacked groups are stacked along the channel layer while surrounding the channel layer, and
wherein each of the stacked groups includes the first stacked body and second stacked body.

3. The semiconductor device of claim 1,
wherein the upper first stress control insulating layer and the lower first stress control insulating layer apply compressive stress or tensile stress as the first stress to the first interlayer insulating layer, and
wherein the upper second stress control insulating layer and the lower second stress control insulating layer apply the compressive stress or the tensile stress as the second stress to the second interlayer insulating layer.

4. The semiconductor device of claim 1,
wherein the first interlayer insulating layer includes a silicon oxide, and the upper first stress control insulating layer and the lower first stress control insulating layer include germanium (Ge) or carbon (C), and
wherein the second interlayer insulating layer includes a silicon oxide, and the upper second stress control insulating layer and the lower second stress control insulating layer include germanium (Ge) or carbon (C).

5. The semiconductor device of claim 1, wherein one of the first stress and the second stress is a compressive stress, and the other is a tensile stress.

6. A semiconductor device, comprising:
a channel layer; and
insulating structures surrounding the channel layer and stacked to be spaced apart from one another,
wherein each of the insulating structures includes:
a first stress control insulating layer inducing a first stress;
a second stress control insulating layer inducing a second stress in directions opposite to the first stress; and
an interlayer insulating layer arranged between the first stress control insulating layer and the second stress control insulating layer,
wherein the interlayer insulating layer includes a silicon oxide, and
wherein one of the first stress control insulating layer and the second stress control insulating layer is formed of an oxide including a material having a smaller lattice constant than a silicon constituting a lattice structure of the silicon oxide, and the other is formed of an oxide including a material having a greater lattice constant than the silicon.

7. The semiconductor device of claim 6, further comprising conductive patterns surrounding the channel layer and arranged between the insulating structures adjacent to each other.

8. The semiconductor device of claim 7, wherein each of the conductive patterns is arranged between a lower stress layer consisting of the first stress control insulating layer and an upper stress layer consisting of the second stress control insulating layer.

9. The semiconductor device of claim 6, wherein one of the first stress control insulating layer and the second stress control insulating layer applies a compressive stress to the interlayer insulating layer, and the other applies a tensile stress to the interlayer insulating layer.

10. The semiconductor device of claim 6,
wherein one of the first stress control insulating layer and the second stress control insulating layer includes germanium (Ge) and the other includes carbon (C).

11. A semiconductor device, comprising:
a first stacked body having a first end portion forming a first stair structure;
a second stacked body arranged to be spaced apart from the first stacked body, wherein the second stacked body has a second end portion forming a second stair structure and the second end portion adjacent to the first end portion of the first stacked body;
contact plugs contacting the first end portion and the second end portion; and
a stress control insulating layer filling a space between the first end portion and the second end portion and penetrated by the contact plugs,
wherein the stress control insulating layer includes:
a first material layer arranged closer to the first stacked body than the second stacked body; and
a second material layer arranged closer to the second stacked body than the first stacked body, and
wherein the stress control insulating layer applies stress toward at least one of the first stacked body and the second stacked body.

12. The semiconductor device of claim 11, wherein the first material layer and the second material layer include materials having different lattice constants from each other.

13. The semiconductor device of claim 11,
wherein the first material layer includes a silicon oxide, and
wherein the second material layer is formed of an oxide including germanium (Ge) or an oxide including carbon (C).

* * * * *